United States Patent
Chen et al.

(10) Patent No.: US 7,233,522 B2
(45) Date of Patent: Jun. 19, 2007

(54) NAND MEMORY ARRAY INCORPORATING CAPACITANCE BOOSTING OF CHANNEL REGIONS IN UNSELECTED MEMORY CELLS AND METHOD FOR OPERATION OF SAME

(75) Inventors: En-Hsing Chen, Sunnyvale, CA (US); Andrew J. Walker, Mountain View, CA (US); Roy E. Scheuerlein, Cupertino, CA (US); Sucheta Nallamothu, San Jose, CA (US); Alper Ilkbahar, San Jose, CA (US); Luca G. Fasoli, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 163 days.

(21) Appl. No.: 10/729,831

(22) Filed: Dec. 5, 2003

(65) Prior Publication Data

US 2004/0145024 A1    Jul. 29, 2004

Related U.S. Application Data

(63) Continuation-in-part of application No. 10/335,078, filed on Dec. 31, 2002.

(51) Int. Cl.
*G11C 16/04*    (2006.01)

(52) U.S. Cl. ............... 365/185.02; 365/185.11; 365/185.17; 365/185.18; 365/185.24; 365/185.28

(58) Field of Classification Search ........... 365/185.02, 365/185.17, 185.18, 185.23, 185.28, 185.29
See application file for complete search history.

(56) References Cited

U.S. PATENT DOCUMENTS 4,142,176 A    2/1979    Dozier
(Continued)

FOREIGN PATENT DOCUMENTS

EP    0 528 367 A1    2/1993
(Continued)

OTHER PUBLICATIONS

Durisety, Chandra Sekhar Acharyulu, "Analysis and Characterization of Single-Poly Floating Gate Devices in 0.35um PDSOI Process", A Thesis Presented for the Master of Science Degree, The University of Tennessee, Knoxville, Dec. 2002, pp. i-viii and 1-80.

(Continued)

*Primary Examiner*—Amir Zarabian
*Assistant Examiner*—Ly Duy Pham
(74) *Attorney, Agent, or Firm*—Zagorin O'Brien Graham LLP

(57) ABSTRACT

An exemplary NAND string memory array provides for capacitive boosting of a half-selected memory cell channel to reduce program disturb effects of the half selected cell. To reduce the effect of leakage current degradation of the boosted level, multiple programming pulses of a shorter duration are employed to limit the time period during which such leakage currents may degrade the voltage within the unselected NAND strings. In addition, multiple series select devices at one or both ends of each NAND string further ensure reduced leakage through such select devices, for both unselected and selected NAND strings. In certain exemplary embodiments, a memory array includes series-connected NAND strings of memory cell transistors having a charge storage dielectric, and includes more than one plane of memory cells formed above a substrate.

44 Claims, 17 Drawing Sheets

U.S. PATENT DOCUMENTS

| | | |
|---|---|---|
| 4,543,594 A | 9/1985 | Mohsen et al. |
| 4,602,354 A | 7/1986 | Craycraft et al. |
| 4,646,266 A | 2/1987 | Ovshinsky et al. |
| 4,868,616 A | 9/1989 | Johnson et al. |
| 5,197,027 A | 3/1993 | Challa |
| 5,299,166 A * | 3/1994 | Suh et al. ............... 365/185.17 |
| 5,301,144 A | 4/1994 | Kohno |
| 5,412,493 A | 5/1995 | Kunii et al. |
| 5,429,968 A | 7/1995 | Koyama |
| 5,473,563 A | 12/1995 | Suh et al. |
| 5,514,907 A | 5/1996 | Moshayedi |
| 5,568,421 A | 10/1996 | Aritome |
| 5,621,683 A | 4/1997 | Young |
| 5,621,684 A | 4/1997 | Jung |
| 5,644,533 A | 7/1997 | Lancaster et al. |
| 5,682,350 A | 10/1997 | Lee et al. |
| 5,703,382 A | 12/1997 | Hack et al. |
| 5,715,194 A | 2/1998 | Hu |
| 5,729,491 A | 3/1998 | Kim et al. |
| 5,734,609 A | 3/1998 | Choi et al. |
| 5,751,012 A | 5/1998 | Wolstenholme et al. |
| RE35,838 E | 7/1998 | Momodomi et al. |
| 5,812,457 A | 9/1998 | Arase |
| 5,814,853 A | 9/1998 | Chen |
| 5,835,396 A | 11/1998 | Zhang |
| 5,898,615 A | 4/1999 | Chida |
| 5,909,393 A | 6/1999 | Tran et al. |
| 5,923,587 A | 7/1999 | Choi |
| 5,926,415 A | 7/1999 | Shin |
| 5,940,321 A | 8/1999 | Takeuchi et al. |
| 5,969,990 A | 10/1999 | Arase |
| 5,978,265 A | 11/1999 | Kirisawa et al. |
| 5,991,202 A | 11/1999 | Derhacobian et al. |
| 6,005,270 A | 12/1999 | Noguchi |
| 6,034,882 A | 3/2000 | Johnson et al. |
| 6,049,494 A | 4/2000 | Sakui et al. |
| 6,055,180 A | 4/2000 | Gudesen et al. |
| 6,061,270 A | 5/2000 | Choi |
| 6,107,658 A | 8/2000 | Itoh et al. |
| 6,108,238 A | 8/2000 | Nakamura et al. |
| 6,115,287 A * | 9/2000 | Shimizu et al. ......... 365/185.17 |
| 6,118,696 A | 9/2000 | Choi |
| 6,147,911 A | 11/2000 | Takeuchi et al. |
| 6,151,249 A | 11/2000 | Shirota et al. |
| 6,157,056 A | 12/2000 | Takeuchi et al. |
| 6,163,048 A | 12/2000 | Hirose et al. |
| 6,185,122 B1 | 2/2001 | Johnson et al. |
| 6,188,611 B1 | 2/2001 | Endoh et al. |
| 6,266,275 B1 | 7/2001 | Chen et al. |
| 6,291,836 B1 | 9/2001 | Kramer et al. |
| 6,295,227 B1 * | 9/2001 | Sakui et al. ............ 365/185.17 |
| 6,301,155 B1 | 10/2001 | Fujiwara |
| 6,307,807 B1 | 10/2001 | Sakui et al. |
| 6,326,269 B1 | 12/2001 | Jeng et al. |
| 6,335,890 B1 | 1/2002 | Reohr et al. |
| 6,373,095 B1 | 4/2002 | Bracchitta et al. |
| 6,373,746 B1 | 4/2002 | Takeuchi et al. |
| 6,380,636 B1 | 4/2002 | Tatsukawa et al. |
| 6,411,548 B1 | 6/2002 | Sakui et al. |
| 6,420,215 B1 | 7/2002 | Knall et al. |
| 6,434,053 B1 | 8/2002 | Fujiwara |
| 6,445,613 B1 | 9/2002 | Nagai |
| 6,456,528 B1 | 9/2002 | Chen |
| 6,469,933 B2 * | 10/2002 | Choi et al. ............. 365/185.17 |
| 6,473,328 B1 | 10/2002 | Mercaldi |
| 6,477,077 B1 | 11/2002 | Okazawa |
| 6,490,194 B2 | 12/2002 | Hoenigschmid |
| 6,498,747 B1 | 12/2002 | Gogl et al. |
| 6,512,694 B2 * | 1/2003 | Herdt .................... 365/185.17 |
| 6,512,703 B2 | 1/2003 | Sakui et al. |
| 6,515,888 B2 | 2/2003 | Johnson et al. |
| 6,522,583 B2 * | 2/2003 | Kanda et al. ........... 365/185.17 |
| 6,542,407 B1 | 4/2003 | Chen et al. |
| 6,545,898 B1 | 4/2003 | Scheuerlein |
| 6,567,287 B2 | 5/2003 | Scheuerlein |
| 6,567,312 B1 | 5/2003 | Torii et al. |
| 6,570,787 B1 * | 5/2003 | Wang et al. ........... 365/185.17 |
| 6,584,006 B2 | 6/2003 | Viehmann |
| 6,597,609 B2 | 7/2003 | Chevallier |
| 6,611,453 B2 | 8/2003 | Ning |
| 6,614,070 B1 | 9/2003 | Hirose et al. |
| 6,614,688 B2 | 9/2003 | Jeon et al. |
| 6,618,292 B2 | 9/2003 | Sakui |
| 6,621,743 B2 | 9/2003 | Ogane |
| 6,654,281 B2 * | 11/2003 | Georgakos et al. ..... 365/185.05 |
| 6,661,707 B2 * | 12/2003 | Choi et al. ............. 365/185.17 |
| 6,671,204 B2 * | 12/2003 | Im ........................ 365/185.12 |
| 6,735,115 B2 * | 5/2004 | Hsu et al. .............. 365/185.11 |
| 6,747,899 B2 | 6/2004 | Hsia et al. |
| 6,757,196 B1 * | 6/2004 | Tsao et al. ............. 365/185.17 |
| 6,765,813 B2 | 7/2004 | Scheuerlein et al. |
| 6,819,593 B2 * | 11/2004 | Shyu et al. ............. 365/185.17 |
| 6,822,903 B2 | 11/2004 | Scheuerlein et al. |
| 6,845,030 B2 | 1/2005 | Kang et al. |
| 6,845,042 B2 | 1/2005 | Ichige et al. |
| 6,849,905 B2 | 2/2005 | Ilkbahar et al. |
| 6,853,587 B2 * | 2/2005 | Forbes ................... 365/185.28 |
| 6,856,572 B2 | 2/2005 | Scheuerlein et al. |
| 6,859,395 B2 * | 2/2005 | Matsunaga et al. .... 365/185.18 |
| 6,859,410 B2 | 2/2005 | Scheuerlein et al. |
| 6,888,755 B2 * | 5/2005 | Harari ................... 365/185.18 |
| 6,982,902 B2 | 2/2006 | Gogl et al. |
| 7,012,835 B2 | 3/2006 | Gonzalez et al. |
| 7,023,739 B2 * | 4/2006 | Chen et al. ............. 365/185.28 |
| 2001/0055838 A1 | 12/2001 | Walker et al. |
| 2002/0021587 A1 | 2/2002 | Sakui et al. |
| 2002/0028541 A1 | 3/2002 | Lee et al. |
| 2003/0095448 A1 | 5/2003 | Ichige et al. |
| 2003/0109093 A1 | 6/2003 | Harari et al. |
| 2003/0155582 A1 | 8/2003 | Mahajani et al. |
| 2003/0161183 A1 * | 8/2003 | Tran ..................... 365/185.03 |
| 2003/0214835 A1 | 11/2003 | Nejad et al. |
| 2003/0227795 A1 | 12/2003 | Seyyedy et al. |
| 2004/0057276 A1 | 3/2004 | Nejad et al. |
| 2004/0080980 A1 * | 4/2004 | Lee ....................... 365/185.17 |
| 2004/0124415 A1 | 7/2004 | Walker et al. |
| 2004/0124466 A1 | 7/2004 | Walker et al. |
| 2004/0125629 A1 | 7/2004 | Scheuerlein et al. |
| 2004/0125653 A1 | 7/2004 | Tran et al. |
| 2004/0145024 A1 | 7/2004 | Chen et al. |
| 2004/0214379 A1 | 10/2004 | Lee et al. |
| 2005/0018485 A1 | 1/2005 | Noguchi et al. |
| 2005/0111260 A1 * | 5/2005 | Nazarian ............... 365/185.17 |
| 2005/0121790 A1 | 6/2005 | Cleeves et al. |

FOREIGN PATENT DOCUMENTS

| | | |
|---|---|---|
| EP | 0 575 051 A1 | 12/1993 |
| JP | 62-142363 | 6/1987 |
| JP | 62-155568 | 7/1987 |
| JP | 1998-10149688 | 6/1998 |
| JP | 2001-358237 | 12/2001 |
| JP | 2002-280467 | 9/2002 |
| WO | WO-2002-43067 US | 5/2002 |

OTHER PUBLICATIONS

Evans, Robert J., et al., "Energy Consumption Modeling and Optimization for SRAM's," IEEE Journal of Solid-State Circuits, vol. 30, No. 5, May 1995, pp. 571-579.

Jung, Tae-Sung, et al., "A 117-mm$^2$ 3.3-V Only 128-Mb Multilevel NAND Flash Memory for Mass Storage Applications," IEEE Journal of Solid-State Circuits, vol. 31, No. 11, Nov. 1996, pp. 1575-1583.

Kawagoe, Hiroto, et al., "Minimum Size ROM Structure Compatible with Silicon-Gate E/D MOS LSI," IEEE Journal of Solid-State Circuits, vol. SC-11, No. 3, Jun. 1976, pp. 360-364.

Kim, Kyu-Hyoun, et al., "An 8-Bit-Resolution, 360-μs Write Time Nonvolatile Analog Memory Based on Differentially Balanced Constant-Tunneling-Current Scheme (DBCS)," IEEE Journal of Solid-State Circuits, vol. 33, No. 11, Nov. 1998, pp. 1758-1762.

Kim, Byungcheul, et al., "A Scaled SONOS Single-Transistor Memory Cell for a High-Density NOR Structure with Common Source Lines," Journal of the Korean Physical Society, vol. 41, No. 6, Dec. 2002, pp. 945-948.

Kim, Byungcheul, et al., "Single Power Supply Operated and Highly Reliable SONOS EEPROMs," Journal of the Korean Physical Society, vol. 40, No. 4, Apr. 2002, pp. 642-644.

Kitano, Yoshitaka, et al., "A 4-Mbit Full-Wafer ROM," IEEE Journal of Solid-State Circuits, vol. SC-15, No. 4, Aug. 1980, pp. 686-693.

Lee, Yong Kyu, et al., "Multilevel Vertical-Channel SONOS Nonvolatile Memory on SOI," IEEE Electron Device Letters, vol. 23, No. 11, Nov. 2002, pp. 664-666.

Lin, Horng-Chih, et al., "Ambipolar Schottky-Barrier TFTs," IEEE Transactions on Electron Devices, vol. 49, No. 2, Feb. 2002, pp. 264-270.

Najeeb-Ud-Din et al., "Analysis of Floating Body Effects in Thin Film Conventional and Single Pocket SOI MOSFETs Using the GIDL Current Technique", IEEE Electron Device Letters, vol. 23, No. 4, Apr. 2002, pp. 209-211.

Nishihara, Toshiyuki, et al., "A Quasi-Matrix Ferroelectric Memory for Future Silicon Storage," IEEE Journal of Solid-State Circuits, vol. 37, No. 11, Nov. 2002, pp. 1479-1484.

Park, Ki-Tae, "Recent Non-Volatile Memory Device & Circuit Technology," Halo LSI Inc, (date unknown), 35 pages.

Roizin, Yokov, et al., "Plasma-Induced Charging in Two Bit per Cell SONOS Memories," Tower Semiconductor Ltd., Migdal HaEmek 23105, Israel, (date unknown), 4 pages.

Shin, Jongshin, et al., "A New Charge Pump Without Degradation in Threshold Voltage Due to Body Effect," IEEE Journal of Solid-State Circuits, vol. 35, No. 8, Aug. 2000, pp. 1227-1230.

Sturm, J. C., et al., "Leakage Current Modeling of Series-Connected Thin Film Transistors," IEEE Transactions on Electron Devices, vol. 42, No. 8, Aug. 1995, pp. 1561-1563.

Sugibayashi, Tadahiko, et al., "A 30-ns 256-Mb DRAM with a Multidivided Array Structure," IEEE Journal of Solid-State Circuits, vol. 28, No. 11, Nov. 1993, pp. 1092-1098.

Suh, Kang-Deog, et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

Takeuchi, Ken, et al., "A Negative $V_{th}$ Cell Architecture for Highly Scalable, Excellently Noise-Immune, and Highly Reliable NAND Flash Memories," IEEE Journal of Solid-State Circuits, vol. 34, No. 5, May 1999, pp. 675-684.

Thean, Aaron, et al., "Flash memory: towards single-electronics," IEEE Potentials, Oct./Nov. 2002, pp. 35-41.

Patent Abstracts of Japan, vol. 1998, No. 11, Sep. 30, 1998, Arase Kenshirou.

Kim et al. "Scaled SONOSFET NAND Flash EEPROM; The NAND Type Flash EEPROM using the Scaled SONOSFET", Transcripts KIEE, vol. 49C, No. 1, Jan. 2000, pp. 1-7.

Kobayashi et al., "TA 7.2: A 3.3V-Only 16 Mb DINOR Flash Memory," ISSCC95, Session 7, Flash Memory, 1995 IEEE International Solid-State Circuits Conference, pp. 122-123, 349.

Naji, Peter K. et al., "A 256kb 3.0V lTlMTJ Nonvolatile Magnetoresistive RAM," 2001 IEEE ISSCC, Feb. 6, 2001, Paper 7.6, and corresponding presentation slides (35 pages).

* cited by examiner

GLOBAL BIT LINES 103, 107 ON ONE LAYER
GLOBAL BIT LINES 105, 109 ON 2ND LAYER
} FIG. 17B

NAND MEMORY ARRAY INCORPORATING CAPACITANCE BOOSTING OF CHANNEL REGIONS IN UNSELECTED MEMORY CELLS AND METHOD FOR OPERATION OF SAME

CROSS-REFERENCE TO RELATED APPLICATION(S)

This application is a Continuation-in-Part application of prior U.S. application Ser. No. 10/335,078 by Roy E. Scheuerlein, et al, entitled "Programmable Memory Array Structure Incorporating Series-Connected Transistor Strings and Methods for Fabrication and Operation of Same," filed on Dec. 31, 2002, which application is hereby incorporated by reference in its entirety.

This application is related to co-pending U.S. application Ser. No.10/729865 by En-Hsing Chen, et al, entitled "NAND Memory Array Incorporating Multiple Series Selection Devices and Method for Operation of Same," filed on even date herewith, which application is hereby incorporated by reference in its entirety; and to co-pending U.S. application Ser. No. 10/729,844 by En-Hsing Chen, et al, entitled "NAND Memory Array Incorporating Multiple Write Pulse Programming of Individual Memory Cells and Method for Operation of Same," filed on even date herewith, which application is hereby incorporated by reference in its entirety; and to co-pending U.S. application Ser. No. 10/729,843 by Luca G. Fasoli, et al, entitled "Memory Array Incorporating Memory Cells Arranged in NAND Strings," filed on even date herewith, which application is hereby incorporated by reference in its entirety.

BACKGROUND

The present invention relates to semiconductor integrated circuits containing memory arrays, and in preferred embodiments the invention particularly relates to monolithic three-dimensional memory arrays having series-connected memory cells.

Recent developments in semiconductor processing technologies and memory cell technologies have continued to increase the density achieved in integrated circuit memory arrays. For example, certain passive element memory cell arrays may be fabricated having word lines approaching the minimum feature size (F) and minimum feature spacing for the particular word line interconnect layer, and also having bit lines approaching the minimum feature width and minimum feature spacing for the particular bit line interconnect layer. Moreover, three-dimensional memory arrays having more than one plane or level of memory cells have been fabricated implementing such so-called $4F^2$ memory cells on each memory plane. Exemplary three-dimensional memory arrays are described in U.S. Pat. No. 6,034,882 to Johnson, entitled "Vertically Stacked Field Programmable Nonvolatile Memory and Method of Fabrication."

A variety of other memory cells technologies and arrangements are also known. For example, NAND flash and NROM flash EEPROM memory arrays are known to achieve relatively small memory cells. Other small flash EEPROM cells are known which use hot electron programming, such as NROM and floating gate NOR flash memory arrays.

An extremely dense memory array may be achieved using a NAND-style arrangement, which includes series-connected NAND strings of memory cell devices. Each NAND string of memory cells typically includes a first block select device which couples one end of the NAND string to a global line, a plurality of series-connected memory cells, and a second block select device which couples the other end of the NAND string to a bias node associated with the string. A memory array may include a number of memory blocks, with each block including a plurality of NAND strings which share the same word lines. Two block select signals for the block are typically routed to each NAND string of the block.

A basic NAND string is a very efficient structure, capable of achieving a $4F^2$ layout for the incremental transistor memory cell. Density is also improved because the block select lines may be routed in continuous polysilicon stripes across the array block, just like the word lines, without any provision being otherwise required for contacting a block select signal line to some but not all of the block select transistors formed in the NAND strings.

For many NAND string memory arrays (i.e., those employing series-connected memory cells), tradeoffs exist when choosing the various bias voltages applied to selected and unselected memory cells during programming, and the relative timing of the application of these voltages. Conditions must be chosen to ensure adequate programming of the selected memory cells, but also to ensure that unselected memory cells within the selected NAND string are not unintentionally "disturb programmed" and further to ensure that memory cells in an unselected NAND string adjacent to the selected NAND string (i.e., sharing the same word lines) are also not unintentionally disturbed during programming. Despite progress to date, continued improvement in memory array structures and methods of their operation are desired. Moreover, improvements in such memory array structures which may be fashioned into a three-dimensional memory array are highly desired.

SUMMARY

When programming a NAND string memory array, a tradeoff may exist in the choice of the bias voltages applied to unselected memory cells within a selected NAND string relative to those bias voltages applied to unselected memory cells within unselected NAND strings, and particularly those unselected memory cells that share the selected word line with the selected memory cell. A higher inhibit voltage conveyed to the unselected NAND string reduces program disturb effects on the memory cell associated with the selected word line (i.e., the "half selected memory cell"). However, a higher inhibit voltage may cause non-selected cells in the selected NAND string to be disturbed during programming if the voltage of unselected word lines is correspondingly higher.

Program disturb effects on half-selected memory cells may be substantially reduced by initially biasing the channel of a half-selected cell to a first voltage, and then capacitively boosting the channel to a much higher voltage by the programming pulse on the selected word line. This reduces the voltage across the half-selected memory cell and consequently reduces unintentional program disturb effects. In various embodiments, a given programming pulse may be a multi-level pulse, and may be accompanied by a respective multi-level pulse on unselected word lines and on the select lines, to initially bias an unselected NAND string to an inhibit voltage, and then to decouple at least the half-selected memory cell channel from the bias voltage source to allow the channel to be boosted above the inhibit voltage without the capacitive loading of other memory cell channels within the string. In certain embodiments, such a multi-level pulse may be accomplished using two discrete pulses of different magnitude, which together correspond to a single programming pulse.

Boosted voltage levels in the unselected channels may cause increased leakage current through the select devices of the unselected NAND strings. These leakage currents may be reduced by use of multiple series select devices at one or both ends of each NAND string. Preferably a lower voltage is provided to at least one series device that is below the threshold of the device, to ensure the string is shut off, and another higher voltage provided to at least one other series device to reduce the magnitude of leakage currents that otherwise may flow.

Multiple programming pulses of much shorter duration may be employed to limit the time period during which such leakage currents may degrade the voltage within the unselected NAND strings. The number and duration of these multiple programming pulses are chosen to maintain the aggregate program stress time on the selected memory cell(s) to ensure adequate programming. Preferably the initial bias conditions within unselected NAND strings are re-established before each such programming pulse so that the effect of any leakage degradation of its boosted channel voltage during one programming pulse is not cumulative with subsequent programming pulses.

In certain exemplary embodiments, a flash memory array includes series-connected NAND strings of memory cell transistors having a charge storage dielectric, such as for example, SONOS devices. Each NAND string of memory cells includes a first group of at least one select device which couples one end of the NAND string to a global bit line, and a second group of at least two block select devices which couples the other end of the NAND string to a shared bias node associated with the string. Preferably the select devices are also SONOS devices and may be formed in an identical fashion as the memory cell transistors, thus reducing the number of different structures necessary for each NAND string.

In certain embodiments, pairs of NAND strings within a memory block on a level of the memory array may share the same global bit line. In other embodiments, each NAND string within a block is associated with a respective own global bit line which is not shared by other NAND strings sharing the same word lines.

In certain embodiments, the select devices and the memory cells devices are SONOS devices. A range of threshold voltages is contemplated, but preferably such devices are formed having a depletion mode threshold voltage. Even more preferably the select devices and the memory cells devices are N-channel devices having a thermal equilibrium threshold voltage of −2 to −3 volts. For the memory cells, such a threshold voltage preferably corresponds to an erased data state, and the memory cells are programmed to a near depletion threshold voltage of from −1 volt to 0 volts. The select devices are preferably fabricated having the same thermal equilibrium threshold voltage but are maintained in a programmed state having a near depletion mode threshold voltage.

The invention in several aspects is particularly suitable for implementation within an integrated circuit, including those integrated circuits having a memory array, for memory array structures, for methods for operating such integrated circuits and memory arrays, and for computer readable media encodings of such integrated circuits or memory arrays, all as described herein in greater detail and as set forth in the appended claims. A wide variety of such integrated circuits is specifically contemplated, including those having a three-dimensional memory array formed above a substrate, having memory cells formed on each of several memory planes (i.e., memory levels).

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

FIGS. 17A, 17B, 17C, 17D, and 17E depict various layout arrangements useful in certain memory array configurations.

The use of the same reference symbols in different drawings indicates similar or identical items.

DETAILED DESCRIPTION

Figure 1:
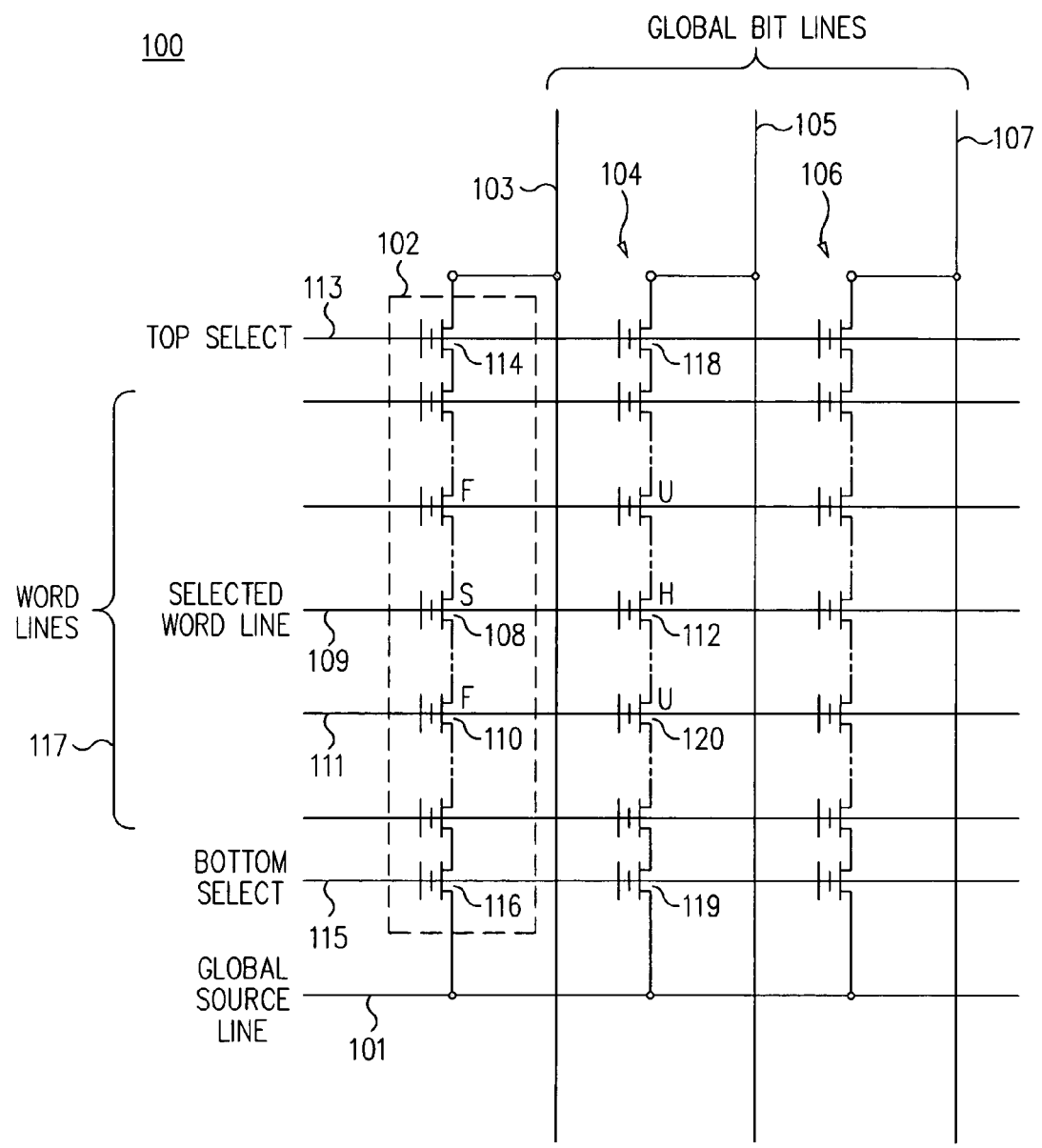
FIG. 1 depicts a portion of a non-mirrored NAND string memory array configuration in accordance with certain embodiments of the present invention.

Referring now to FIG. 1, an electrical schematic is shown of a portion of an exemplary memory array 100. The portion shown may represent a two-dimensional array having only one plane of memory cells, or may represent one level of three-dimensional memory array having more than one level (i.e., more than one plane) of memory cells. A plurality of series-connected NAND transistor strings 102, 104, 106 are shown. Each string includes a plurality of SONOS transistors connected in series, each gated by a respective one of a plurality of word lines 1117. The NAND string 102 also includes a block select device 114 for coupling one end of the NAND string to a global bit line 103 in accordance with a block select signal TOP SELECT conveyed on node 113, and further includes a second block select device 116 for coupling the other end of the NAND string to a shared bias node 101 in accordance with a block select signal BOTTOM SELECT conveyed on node 115.

Each NAND string 102, 104, 106 are disposed within the same block within the memory array, and each is respectively coupled to its associated global bit line 103, 105, 107. Such global bit lines may be conveyed by a wiring level below the array, or alternatively above the array, or alternatively on a wiring level within the array (e.g., in a three-dimensional array having more than one level). The NAND strings 102, 104, 106 may be referred to as "adjacent" NAND strings, as they share the same word lines (i.e., within the same block of the array), even though they do not share global bit lines. For the arrangement shown, the shared bias node 101 may also be known as a global source line.

The block select signals TOP SELECT and BOTTOM SELECT, the word lines 117, and the global source line 101 all traverse across the memory array in the same direction (for convenience, here shown as horizontally), so that they may be more conveniently decoded and driven to appropriate levels, as described below. The global bit lines 103, 105, 107 traverse across the memory array generally in an orthogonal direction (for convenience, here shown as vertically). Only four such passing word lines 111 and one selected word line 109 are depicted, but it should be appreciated that in practice each NAND string may include many such word lines, such as 16 total word lines.

As described above, the memory cells in the NAND strings (i.e., those gated by one of the word lines) are preferably SONOS structures. As used herein, the term SONOS is used broadly and is meant to refer to the general class of transistor devices having a charge storage dielectric layer between the gate and the underlying channel, and is not used in a restrictive sense to merely imply a literal silicon-oxide-nitride-oxide-silicon layer stack. For example, other kinds of charge storage dielectric layers may be employed, such as oxynitrides, as well as other kinds of memory cell structures, as is described in greater detail herebelow.

A basic NAND string is a very efficient structure, capable of achieving a $4F^2$ layout for the incremental transistor memory cell. Density is also improved because the two block select lines 113, 115 may be routed in continuous polysilicon stripes across the array block, just like the word lines, without any provision being otherwise required for contacting a block select signal line to some but not all of the block select transistors formed in the NAND strings.

Another factor contributing to the efficiency of this array structure is the ability of the block select devices to be fabricated identically to the memory cell devices. In other words, the block select devices may be SONOS devices just like the memory cell devices. In 3D array embodiments having more than one memory level formed above a semiconductor substrate, each memory level consequently includes only one type of device, further simplifying the fabrication of each level. The block select devices may be sized identically to the memory cell devices, but in certain embodiments may have a longer channel length (i.e., wider polysilicon stripe for the block select signals) to increase the breakdown voltage of the block select devices. In other embodiments the block select lines could be normal TFT MOS devices without a charge storage dielectric. This would add process complexity but would allow better optimizing the select devices for lower leakage.

In a preferred embodiment, the memory cell devices and block select devices are both SONOS devices which are implanted to shift the thermal equilibrium (i.e., minimum trapped negative charge in the nitride) threshold voltage $V_T$ to depletion mode. A depletion mode implant that is a slow diffuser, preferably antimony or arsenic, is preferably used because of the relatively higher diffusion of such dopants in a polycrystalline layer compared with a crystalline substrate, and also due to the extremely small dimensions of the devices. The erased state $V_T$ is substantially depletion mode, preferably −2V to −3V threshold, while the programmed state $V_T$ is preferable about zero volts. The memory cells are programmed or erased to one of the two threshold voltages according to the data state, but the block select devices are preferably programmed to have about a one-volt threshold voltage and maintained in this programmed state. Suitable fabrication methods are described in U.S. application Ser. No. 10/335,089 by Andrew J. Walker, et al, entitled "Method for Fabricating Programable Memory Array Structures Incorporating Series-Connected Transistor Strings," filed on Dec. 31, 2002, which application is hereby incorporated by reference in its entirety.

In the descriptions that follow, assume that the NAND string 102 is selected for programming, and that memory cell 108 is to be programmed. The global bit line 103 associated with the selected NAND string 102 (i.e., the selected global bit line) is typically brought to (or held at) ground. The TOP SELECT signal and the other word lines between the selected memory cell 108 and the select device 114 (i.e., the "passing" word lines) are driven to a high enough voltage to turn each respective device on and thereby couple the global bit line voltage to the channel of the selected memory cell 108. Then, the word line 109 associated with the selected memory cell 108 (i.e., the selected word line) is typically driven to a high level programming voltage, such as about 13 V (for certain embodiments). Consequently, a programming stress is developed across the selected memory cell (here labeled as an "S" cell) that is equal in magnitude to the word line programming voltage (i.e., $V_{PROG}$) minus the selected channel voltage (e.g., ground), and which programming stress is developed for a time equal to the length of the programming pulse applied to the selected word line, to program the selected cell.

Other memory cells associated with the selected word line, such as memory cell 112, experience the same word line programming voltage but should be inhibited from being programmed. Such a cell 112 is "half-selected" and may be termed as "H" cell. To inhibit programming of the H cell 112, the global bit line 105 associated with the unselected NAND string 104 (i.e., the inhibited global bit line) is typically brought to a voltage between ground and the program voltage (e.g., a positive voltage less than the programming voltage) which may be termed an inhibit voltage. The TOP SELECT signal and the passing word lines between the unselected memory cell 112 and the select device 118 are driven to a high enough voltage to turn each respective device on and thereby couple the inhibit voltage to the channel of the half-selected memory cell 112. When the selected word line 109 is driven to the programming voltage, the stress developed across the half-selected memory cell is much less than the programming stress on the selected cell, and programming is inhibited. For example, if an inhibit voltage of 6 V is coupled to the half-selected memory cell, the "disturb" stress on the half-selected cell 112 is equal in magnitude to the word line programming voltage (i.e., $V_{PROG}$) minus the selected channel voltage (e.g., 6V), and which disturb stress is developed for a time equal to the length of the programming pulse applied to the selected word line.

As may be appreciated, a tradeoff exists in the selection of the inhibit voltage $V_{INH}$ and the passing word line voltage $V_{PASS}$. As the value of these voltages approach the programming voltage, the disturb stress applied to the half-selected memory cell is reduced, and such cells are much less prone to unintentional programming (i.e., $V_{INH}$ disturb). However, with such a high passing word line voltage, other memory cells within the selected NAND string 102 (such as "F" cell 110) are more likely to be unintentionally programmed because their channels are at ground just like the selected memory cell (i.e., $V_{PASS}$ disturb). Desirable structures and operating conditions achieve a balance between these two competing phenomena. In addition, driving such large circuit nodes to voltages typically higher than the upper power supply voltage received by an integrated circuit consumes considerable power and requires large circuit structures to accomplish. In addition, the "U" cell 120 is effected by both the $V_{INH}$ and the $V_{PASS}$ voltage. It is desirable to keep the $V_{INH}$ and $V_{PASS}$ voltages within one or two volts of each other so the voltage stress across the U cells is only one or two volts. The U cell is stressed for a larger number of cycles than either the F cell or the H cell and thus benefits from a low stress voltage.

Such a balance may be more easily achieved by using a lower inhibit voltage and a lower passing word line voltage (at least during the word line programming pulse), and capacitively coupling (i.e., "boosting") the channel of an H cell to a higher voltage during the selected word line programming pulse. As a result, the stress across the F cells is reduced because the passing word line voltage is lower, and yet the stress across the H cell is also reduced because its channel is boosted in the direction of the selected word line programming pulse to a voltage closer to the selected word line than its initial bias voltage. Since the capacitance between word line and TFT channel is relatively high (compared to floating gate approaches), and the capacitance between the TFT channel and "ground" is relatively low (compared to NAND strings fabricated in a semiconductor substrate (i.e., bulk approaches)), an inversion layer of a device in an inhibited string can be capacitively boosted very effectively.

An advantage of NAND strings formed in dielectric isolated TFT channel stripes is a lack of field leakage currents between physically adjacent NAND strings. However, biasing an unselected NAND string to a high voltage, especially if one or more channels therein are capacitively coupled and left floating, leaves the string more susceptible to large field-enhanced leakage currents in thin film transistor (TFT) devices that are supposed to be off, such as block select device 119 within the unselected NAND string 104, and block select device 116 in the selected NAND string. Since these two devices share a common drain node and a common gate node, some choices of gate and drain voltages create a sneak path that can lead to large power dissipation, further restricting the choices of voltage on the gate and drain. Such a condition aggravates leakage from the NAND strings and may lead to a partial programming (i.e., "soft" programming) of memory cells within the unselected strings. Exemplary circuit structures and methods are described herebelow to successfully reduce such effects.

Figure 2:
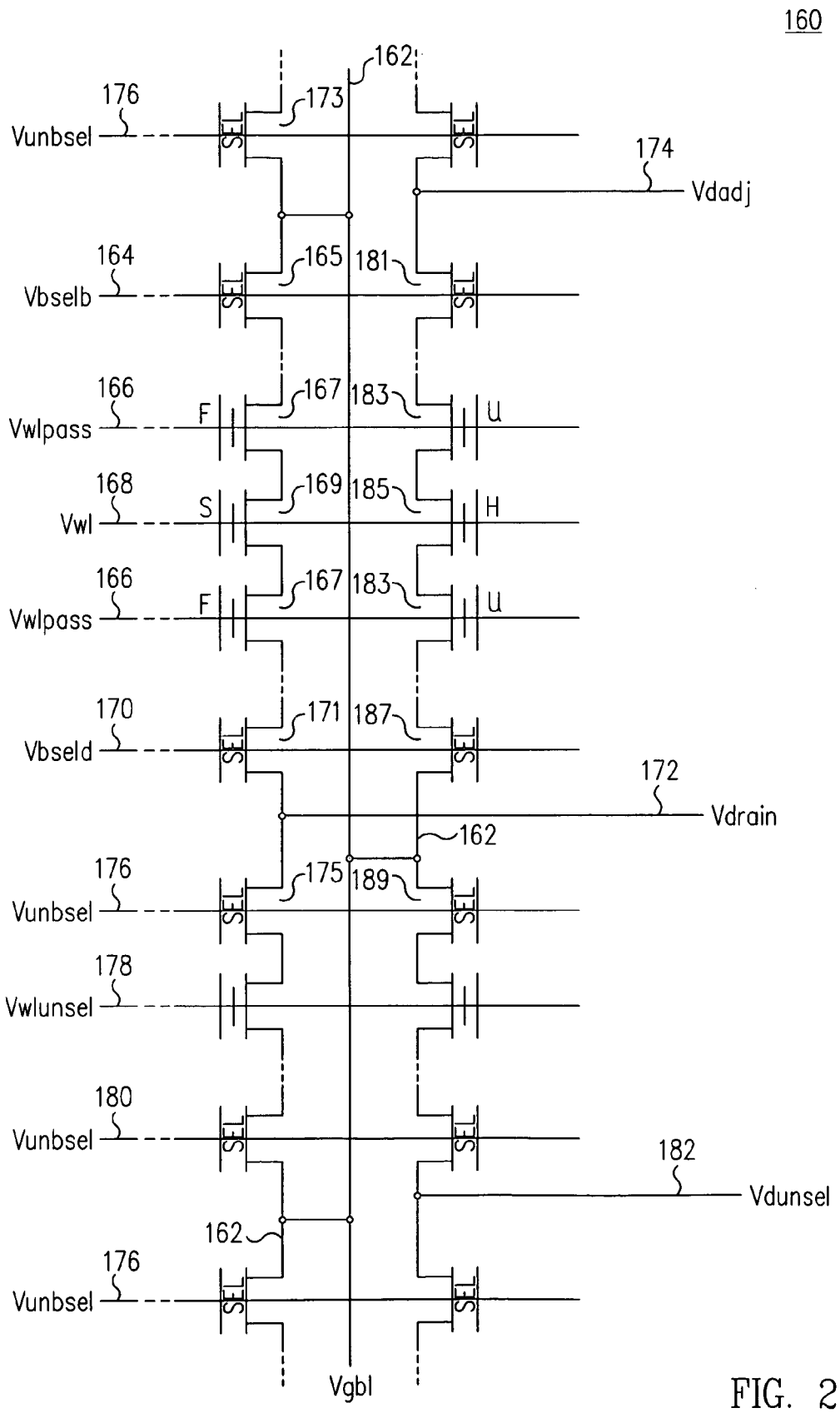
FIG. 2 depicts a portion of a mirrored NAND string memory array configuration in accordance with certain embodiments of the present invention.

However, before describing such structures and methods, an additional NAND string arrangement is useful to describe. Referring now to FIG. 2, a schematic diagram is depicted of a mirrored NAND string arrangement 160 in which two different NAND strings in each of two blocks are coupled to the same global bit line. Again, the portion shown may represent a two-dimensional array having only one plane of memory cells, or may represent one level of three-dimensional memory array having more than one plane of memory cells.

In the descriptions that follow, the upper left NAND string is assumed to be the selected NAND string. The selected word line 168 is driven to a $V_{WL}$ voltage, and the selected memory cell 169 is indicated by an "S." Other non-selected word lines 166 in the same block as the selected word line 168 may be termed "passing" word lines because these are usually driven to a $V_{WLPASS}$ voltage suitable to pass current through its respective memory cell 167 irrespective of the stored data state in its respective memory cell 167. Only two such passing word lines 166 and one selected word line 168 are depicted, but it should be appreciated that in practice each NAND string may include many word lines, such as 16 total word lines.

One end of the selected NAND string is coupled to a global bit line 162 by select device 165 which is controlled by a block select signal conveyed on node 164 having a voltage at any given time known as the $V_{BSELB}$ voltage, which signal may be thought of as the block select signal coupling the selected NAND string to the global bit line. The other end of the selected NAND string is coupled to a shared bias node 172 by select device 171 which is controlled by a block select signal conveyed on node 170 having a voltage of $V_{BSELD}$, which signal may be thought of as the block select signal coupling the selected NAND string to the shared drain line. The voltage of the shared drain line 172 may be known as the $V_{DRAIN}$ voltage.

Another NAND string (not shown) within the block just above the selected block is also coupled to the global bit line 162 by a select device 173 which is controlled by a block select signal conveyed on node 176 having a voltage at any given time known as the $V_{UNBSEL}$ voltage, which signal may be thought of as an unselected block select signal. The two select devices 173 and 165 preferably share a global bit line contact.

An adjacent NAND string is also depicted just to the right of the selected NAND string. As stated above, such adjacent NAND strings at least share the same word lines, and in this arrangement are coupled to the same global bit line (although by two different block selected signals) but do not share the same shared bias node (i.e., shared "drain" node). Here the adjacent NAND string includes devices 181, 183, 185, and 187. The lower end of this adjacent NAND string is coupled to the global bit line 162 by select device 187 which is controlled by the block select signal conveyed on node 170, here referred to as $V_{BSELD}$. The upper end of this adjacent NAND string is coupled to a shared bias node 174 by select device 181 which is controlled by the block select signal conveyed on node 164, $V_{BSELB}$. The voltage of the shared drain line 174 may be known as the $V_{DADJ}$ voltage, representing the drain voltage for an adjacent NAND string.

As with the arrangement shown in FIG. 1, the memory cell in the selected NAND string that is coupled to the selected word line (e.g., cell 169) is an "S" cell, the memory cells in the selected NAND string that are coupled to a passing word line (e.g., cells 167) are "F" cells, the memory cell in the unselected (adjacent) NAND string that is coupled to the selected word line (e.g., cell 185) is an "H" cell, and the memory cells in the unselected NAND string that are coupled to a passing word line (e.g., cells 183) are "U" cells. Such half-selected (H) and unselected (U) memory cells are found in other non-selected NAND strings across the selected memory block. The bias conditions of these four cell types are analogous to those of the non-mirrored arrangement shown in FIG. 1.

Figure 3:
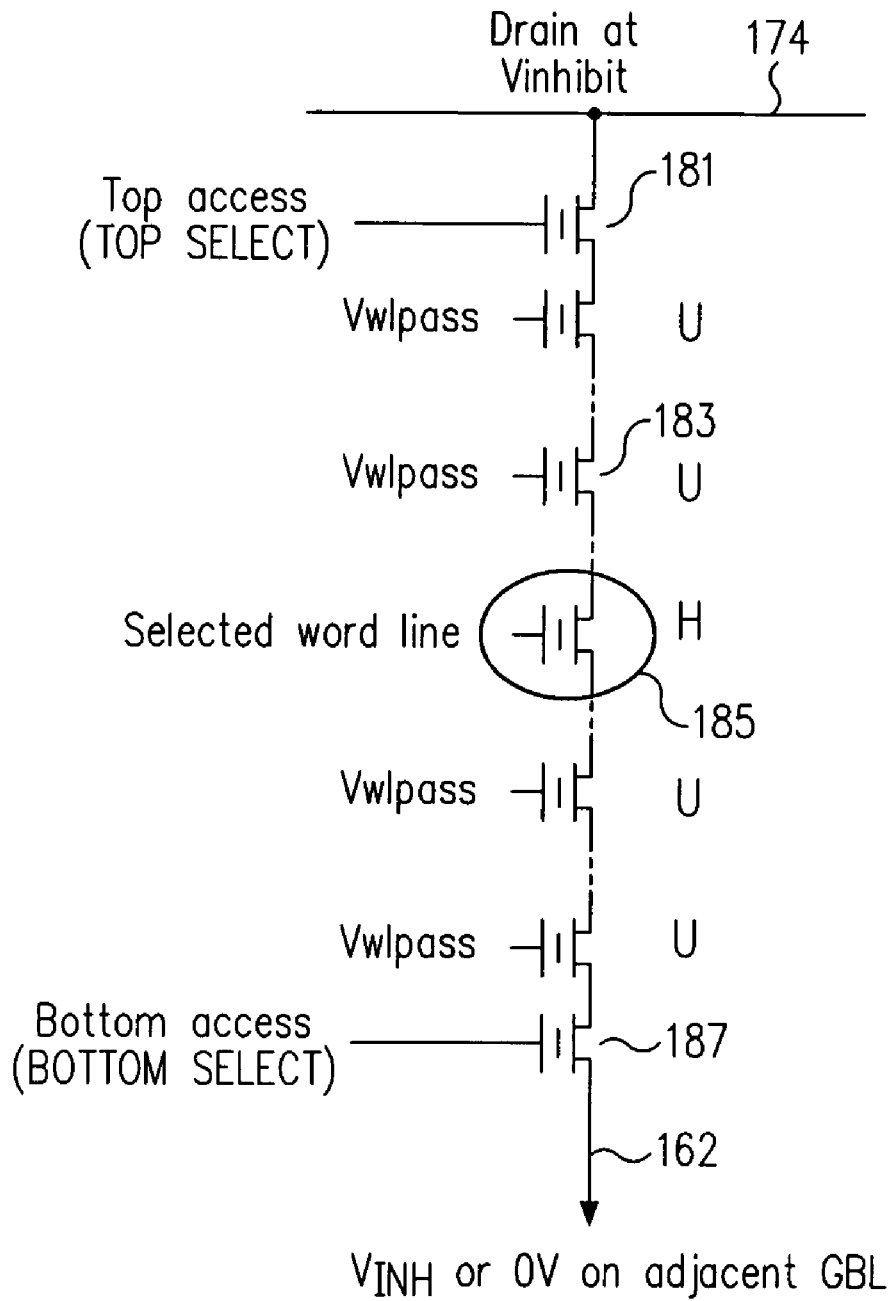
FIG. 3 is a schematic diagram representing a particular NAND string of a mirrored array.

Additional description of this mirrored arrangement 160, including exemplary operating conditions for reading, programming, and erasing memory cells within such an array, may be found in "Method for Fabricating Programmable Memory Array Structures Incorporating Series-Connected Transistor Strings," by Walker, et al., referred to above. In a programming operation, an inhibited (unselected) NAND string is depicted in FIG. 3 in which the selected memory cell within the selected NAND string (not shown, but which shares the same global bit line) is either programmed by driving the global bit line to ground, or is inhibited from programming by driving the global bit line to a bit line inhibit voltage, $V_{INH}$ or $V_{INHIBIT}$. For convenience, the more colloquial node names shown are used to facilitate comparisons herebelow with similar techniques for non-mirrored NAND string arrays and the visual presentation of the NAND string is drawn to suggest a biasing with a higher $V_{INH}$ voltage at the top of the string, and a lower voltage at the bottom end of the string, to which a leakage current may flow through the bottom selection device(s). As used herein, a "block select device," an "access device" and a mere "select device" are all used interchangeably, and consequently a "block select signal," an "access signal" and a mere "select signal" are also all used interchangeably.

Figure 4:
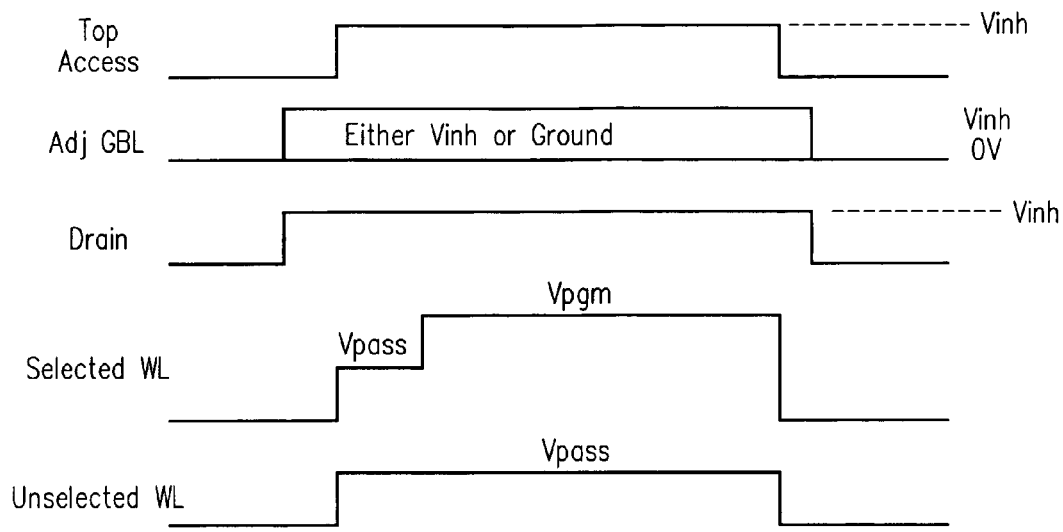
FIG. 4 is a diagram of waveforms for accomplishing capacitive boosting of a non-selected NAND string channel when programming an adjacent NAND string, in accordance with certain embodiments of the present invention.

One method of boosting the channel of an H cell within this mirrored NAND string memory array is depicted in FIG. 4. Assume briefly that all memory cells have the same threshold voltage. Further assume that the Bottom Access select device (e.g., device 187 in FIG. 3, and device 119 in FIG. 1) is off so that, even if the adjacent global bit line is at ground (for programming the selected NAND string), no current will flow through the bottom select device. (As will be described below, such is not necessarily the case.) The drain node at the top of the inhibited NAND string is brought to the inhibit voltage $V_{INH}$, and the selected and passing word lines are all brought to a passing word line voltage $V_{PASS}$. All of the source/drain nodes within the NAND string, as well as the channels of the top select device and the memory cell devices, are all brought to a threshold voltage below the $V_{INH}$ voltage (assuming the $V_{PASS}$ voltage minus a memory cell threshold voltage is greater than the $V_{INH}$ voltage minus the select device threshold). Moreover, at this point the access device turns off, thereby decoupling the NAND string channels from the shared drain node which conveys the $V_{INH}$ voltage.

The selected word line is then driven from the $V_{PASS}$ voltage further upward to the $V_{PGM}$ voltage (also described herein as the $V_{PROG}$ voltage), which couples the H-cell channel upward to a voltage higher than its initial bias level. If all the memory cell devices are turned on, all the channels along the string are still electrically coupled to the H memory cell channel, and all such channels will be capacitively coupled until one or more of the memory cell devices turns off. At that point, the channels "beyond" the turned-off memory cell (i.e., channels farther away from the H memory cell) are decoupled from any further increase in the boosted voltage. Any other channels, including the H cell itself, may be additionally boosted until the selected word line reaches its high level. One device will have the highest threshold and stop the voltage rise of the rest of the string further from the global bit line. Since some cells could have lower threshold than others (some being programmed and some being erased) an unknown number of cell channels along the string may still be electrically connected to the source of the H cell and that entire region will be boosted. As a result, the boosted voltage of the H cell channel is reduced by having to 'drag' additional channels upward in voltage.

Even though a number of cell channels along the string may still be electrically connected to the source of the H cell, the channel is boosted because the select device is turned on momentarily to set the potential of the inhibited NAND string's inversion layer at a threshold voltage below the $V_{DRAIN}$ potential, and then it turns off to decouple the inversion layer from the shared drain node. Once the H-cell channel is boosted, the resultant potential across the tunnel oxide in the H cell is therefore low enough to inhibit programming. For this exemplary embodiment, if there are N memory cells in the string, then N−1 of the word lines (i.e., memory cell gates) are driven to the passing voltage and the selected word line is further driven to the programming voltage after a delay to allow for the channel bias to establish itself along the string.

In certain embodiments, the inhibit voltage $V_{INH}$ and the Top Access signal voltage (which, in this exemplary mirrored arrangement, is also the control gate of the access device connecting the adjacent NAND string to the grounded global bit line) may be set to a relatively low voltage and still turn on sufficiently to provide an adequate connection path to the grounded global bit line. For example, if these access devices have a threshold voltage of around 0V, then the high level of the block select signal (e.g., here the Top Access signal voltage) may have an exemplary value between approximately 1V and 3.3V (e.g., the VDD voltage), the word line passing voltage may ramp from 0V up to approximately 5V, and the word line programming voltage may ramp from 0V to the passing voltage and then to approximately 13V. In some preferred embodiments, the memory cells in a NAND string are programmed sequentially from the "bottom" of the string (furthest away from its associated global bit line) to the top of the string so that all F memory cells "above" the S cell in the string are in the low Vt state (preferably a negative Vt state). Doing so allows a lower passing word line voltage to be used while still providing sufficiently good coupling of the selected memory cell channel region to the grounded global bit line for adequate programming to occur. Moreover, this lower passing voltage guards against unintentional F-cell program disturb (i.e., a $V_{PASS}$ disturb) because the stress across such devices is much less than across the S-cell being programmed.

Boosting the channels of unselected NAND strings as described thus far reduces H-cell disturb, but additional reduction may be desired. This is particularly true for scaled technologies with shorter channel lengths and/or thinner gate oxides, and may allow for even higher programming voltages that are desirable to improve programming performance without negatively impacting disturb programming of unselected NAND strings. Further protection for the H cells also allows additional cells along the word line, because more programming cycles on a given word line are acceptable before a logic one (e.g., a deliberately unprogrammed) state from a previous write cycle, which become the victim H cells for later programming cycles, are disturbed.

Because the devices in the string may be either programmed or un-programmed (i.e., resulting in a variation of threshold voltages in devices in the string), the image charge does not always stay just under the H cell but can spread along the channel. This results in wide variations in the boosted voltage of an H-cell. Also, leakage paths may occur in the select devices (known as "field enhanced leakage current" which may be particularly noticeable in TFT devices relative to bulk devices) which may cause boosted voltage levels in an unselected channel string to leak away at the bottom of the string. A similar leakage current may exist in an "off" select device at the bottom of a selected NAND string, which can flow into the selected string through the bottom select device, thereby increasing the voltage of the string at the bottom and reducing programming efficiency (particularly for cells furthest from the global bit line because of the voltage gradient along the string) and increasing power dissipation.

The protection against H-cell disturb can be improved by decoupling the remainder of the string from the H-cell, and allowing the H-cell channel to be boosted to a greater voltage (assuming, for this description, a positive programming pulse on the selected word line). For example, the top select device may be turned on to set the initial bias of the inversion channels along the inhibited NAND string, as before. The device then turns off to decouple the channel from the inhibit voltage. Before the selected word line is driven to the programming voltage, the word lines on either side of the selected cell are also dropped in voltage to turn off the memory cell devices on either side of the selected memory cell, thus decoupling the H-cell channel from the remainder of the string. Then, when a programming pulse is applied to the selected word line (i.e., when it is driven from a voltage, such as the passing voltage, to the programming voltage), the H-cell channel is boosted to a higher voltage than before, and less program disturb on the H-cell results.

There are many operating conditions which may be utilized to accomplish such enhanced boosting of just the H-cell channel. The passing word line on either side of the selected word line may be brought to ground, and the remaining word lines left at a passing voltage. In the selected NAND string to be programmed, even with ground on the adjacent passing word lines, the programming bit line voltage (ground) may still be passed to the selected cell by using a sequential programming scheme in a string, which assures that the F-memory cell on the bit line side of the selected cell (i.e., one of the adjacent cells whose word line is grounded) is in its erased state and has a preferable threshold voltage close to −3V.

Figure 5:
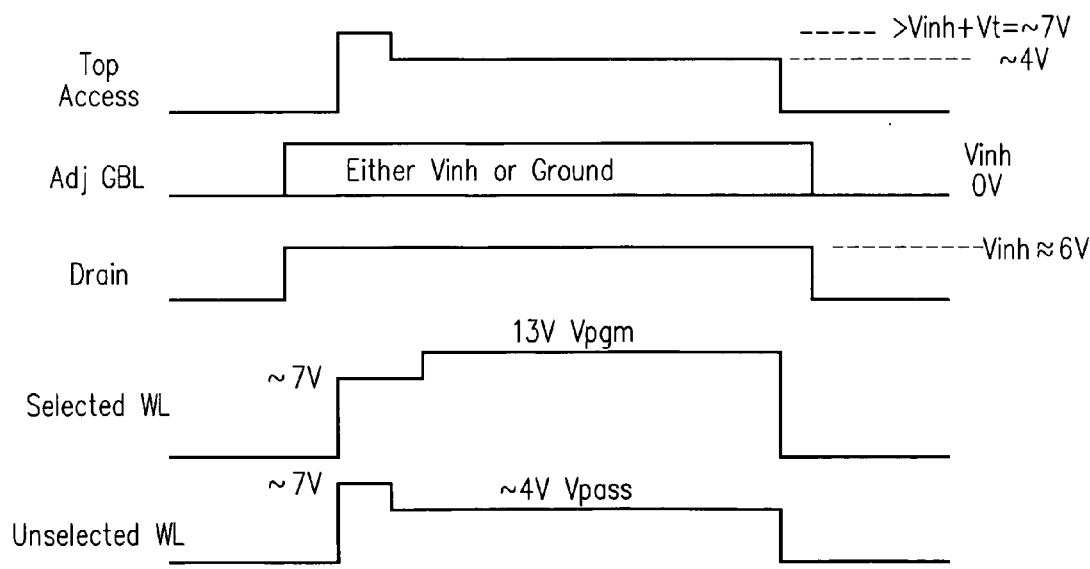
FIG. 5 is a diagram of multi-level waveforms for accomplishing capacitive boosting of a non-selected NAND string channel when programming an adjacent NAND string, in accordance with certain embodiments of the present invention.

Referring now to FIG. 5, representative waveforms for an exemplary technique are depicted to accomplish such decoupling, irrespective of the programmed or erased status of individual memory cells. Here, the Top Access select signal and all word lines are initially driven to a voltage nominally equal to the inhibit voltage $V_{INH}$ plus a threshold voltage, here shown as approximately 7 volts (for an exemplary embodiment). This condition fairly quickly biases the entire string at the $V_{INH}$ voltage, shown here as 6V. Then, the Top Access signal and the word lines other than the selected word line are dropped to a lower passing voltage $V_{PASS}$, here shown as approximately 4V. This decouples the H-cell channel from the inhibited NAND string. Then the selected word line is driven from the initial bias level (e.g., 7V) upward to the full programming voltage, here shown as 13V, to program the selected cell. The H-cell channel is boosted to a voltage even closer to the programming voltage than before (e.g., for the exemplary positive programming pulse shown, boosted to an even higher voltage than before). As may be appreciated, the word lines are driven to an initial level that is high enough to initially bring the unselected string channels to the inhibit voltage (through any combination of programmed and un-programmed cells) and then dropped in voltage by at least the maximum Vt variation of cell devices to isolate the H cell in spite of the threshold variations. Using a lower passing voltage during the programming pulse also has the advantage of reducing the stress on F cells in the selected string, which cells can otherwise be disturbed from an erased state by a high $V_{PASS}$ voltage while the selected string is pulled to ground for programming the S cell.

As long as the $V_{PASS}$ voltage is less than the $V_{INH}$ voltage plus a threshold of an erased memory cell, the neighboring cells around the H-cell will be turned off and the string decoupled from the H-cell before the programming pulse. Moreover, this passing voltage may be any value greater than the bit line programming voltage (e.g., ground) plus the threshold of an erased cell (e.g., −2V or −3V). For example, a passing voltage of ground may be adequate in some embodiments. In the selected NAND string to be programmed, the bit line programming voltage (ground) is passed to the selected cell even with ground on the word lines around it since a preferred sequential programming scheme ensures that any memory cells on the bit line side of the selected memory cell (i.e., between the selected cell and the select device coupled to the bit line) are still in the erased state. The gate of the select device, which is preferably kept programmed to at least a slight positive threshold voltage (Vt), is preferably driven to a voltage higher than its Vt plus the inhibit voltage so it is not the first device in the string to shut off (e.g., so that the $V_{INH}$ voltage is passed to the NAND string memory cells).

Figure 6:
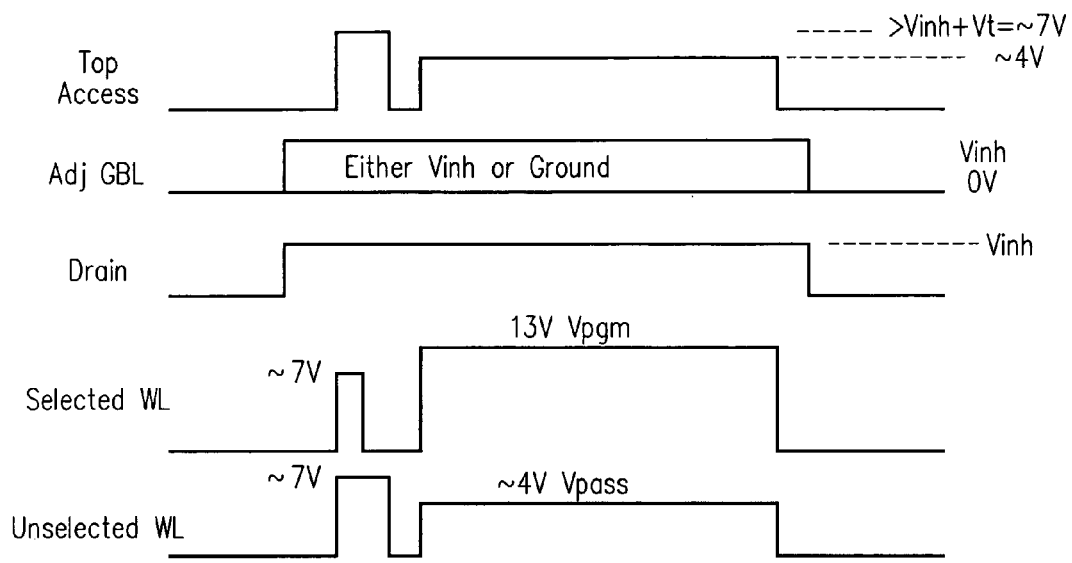
FIG. 6 is a diagram of dual pulse multi-level waveforms for accomplishing capacitive boosting of a non-selected NAND string channel when programming an adjacent NAND string, in accordance with certain embodiments of the present invention.

As depicted in FIG. 5, the signals conveyed to the unselected word lines and to the top select device are respective multilevel pulses, driven first to a higher voltage and then to a lower voltage. Alternatively, as depicted in FIG. 6, two sequential pulses may be used, the first one driven to a higher voltage, and the second one driven to a lower voltage. In either case, it is preferable that the selected word line is brought back to at least the $V_{PASS}$ voltage before the unselected word lines are brought down, to reduce out coupling near the selected memory cell.

In certain cases, additional protection against H cell disturb is desired. This is particularly true for scaled technologies with shorter channel lengths and or thinner gate oxides, and may also provide for higher programming voltages that are desirable to improve programming performance. Moreover, in spite of the assumptions thus far in these descriptions that the select device at the bottom of the unselected string is turned off, this is frequently not the case. Such a selection device, even with ground on its gate terminal, may still leak enough to discharge the channels within an inhibited string, particularly if the channels were boosted to (and remain floating at) at relatively high level, and even more particularly for TFT devices (which may exhibit more leakage than a bulk device).

Figure 7:
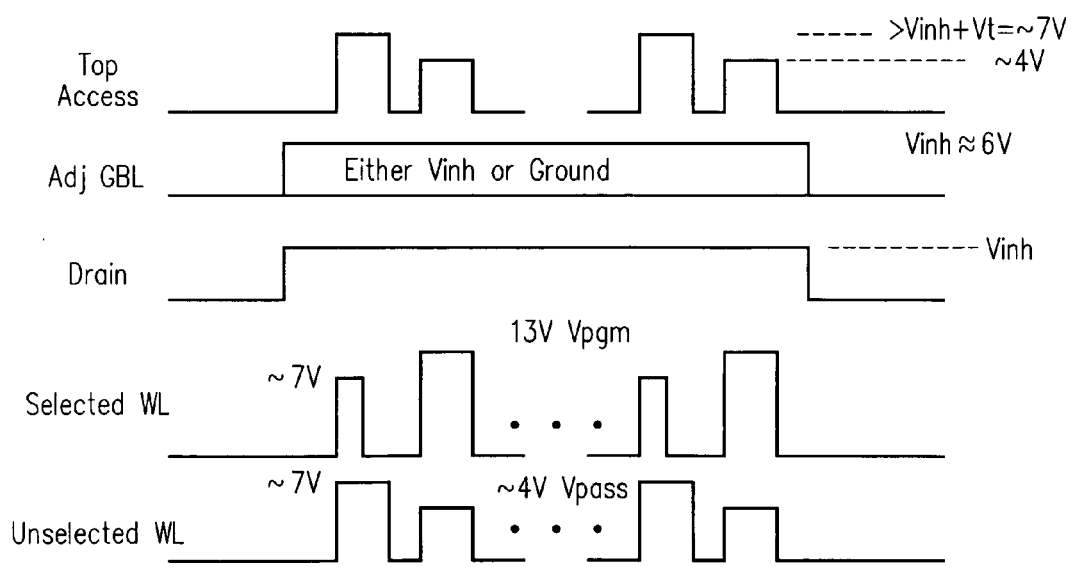
FIG. 7 is a diagram of a sequence of multiple dual-pulse multi-level waveforms for accomplishing capacitive boosting of a non-selected NAND string channel when programming an adjacent NAND string, in accordance with certain embodiments of the present invention.

As depicted in FIG. 7, an exemplary set of programming waveforms are depicted in which multiple cycles of these multi-level pulses (as shown in FIG. 6) are employed. By so doing, each individual pulse is much shorter than before, and any leakage current through the bottom select device has less time to discharge the string. With each pulse, the initial bias within the string is re-established, and then the string (or at least the H-cell channel) is capacitively boosted. The result is a channel that remains more nearly at its peak boosted voltage when pulsed repeatedly with many shorter pulses than if pulsed once with a much longer pulse, especially for the cell closest to the bottom access device and when the other side of the access device is at ground (as in a mirrored configuration when programming the adjacent string). For a selected cell, programming is unaffected by the use of a large number of shorter pulses as long as the aggregate programming stress time is unchanged. Exemplary programming pulses may be less than 1 microsecond in duration, and a corresponding aggregate programming time longer than 10 microseconds. Exemplary programming voltage is within the range from 10 to 16 volts, and preferably around 13 V.

Figure 8:
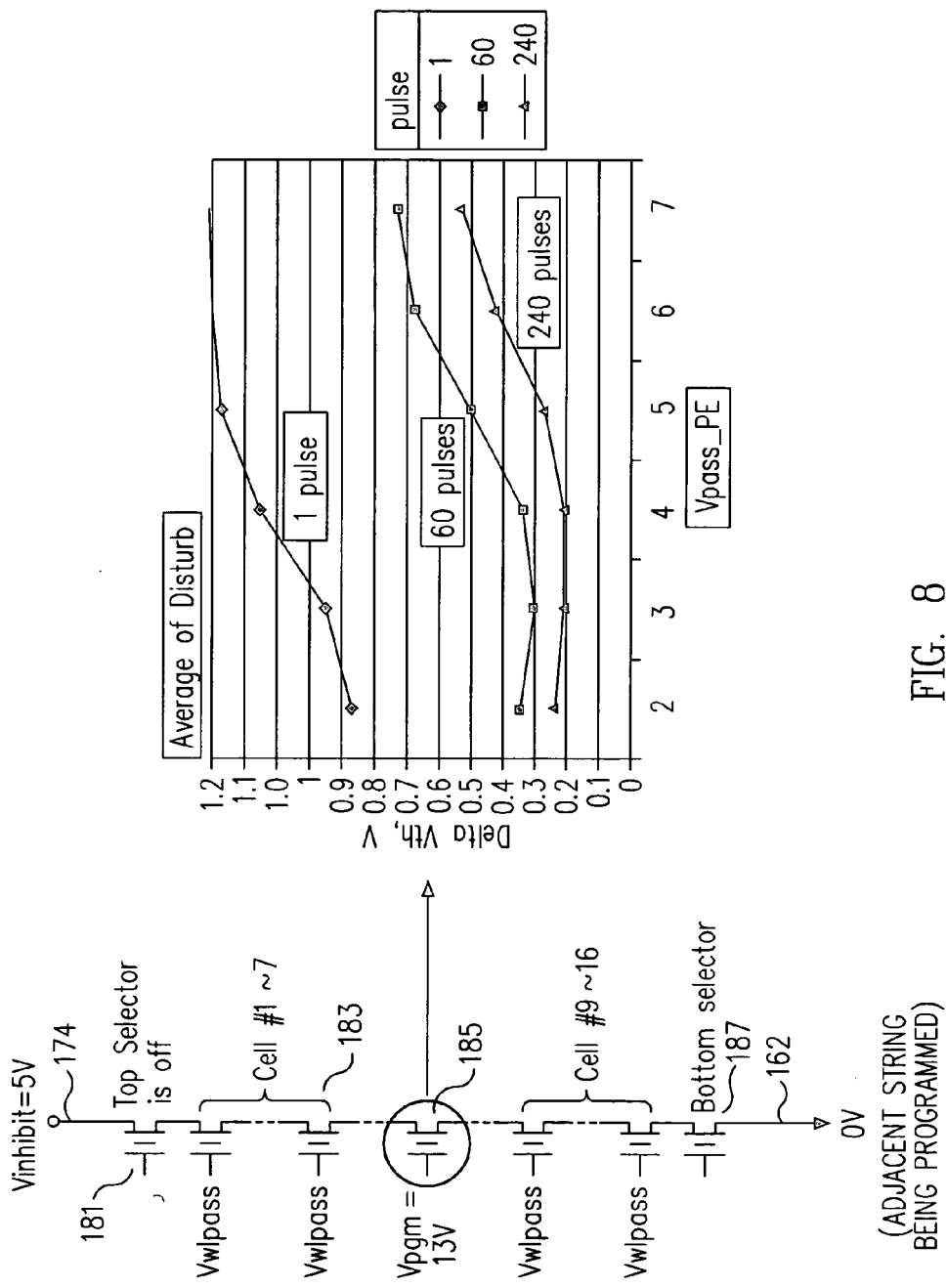
FIG. 8 is a graph depicting the amount of disturb programming of an unselected memory cell in an unselected NAND string, relative to the passing voltage on unselected word lines, for three different cases which vary the number of programming pulses used to program an adjacent NAND string, for an exemplary mirrored NAND string configuration.

FIG. 8 shows the effects of multiple pulse programming on program disturb for an exemplary NAND string technology in a mirrored configuration. The assumptions are a string whose channels were initially biased to an inhibit voltage of 5V minus the threshold voltage of the top selection device 181. The top selection device 181 is off, and the bottom selection device 187 is biased assuming the global bit line 162 is conveying a grounded bit line programming voltage to the adjacent NAND string. The graph depicts the amount of disturb shift in H-cell threshold voltage as a function of the passing voltage $V_{PASS}$ presented to the unselected word lines during the programming pulse, for several different numbers of programming pulses (each case having the same aggregate time). As may be observed for any given case, higher $V_{PASS}$ voltages result in higher disturb programming because of greater leakage through the bottom selection device. In addition, using more programming pulses greatly reduces the disturb programming (i.e., when keeping the aggregate programming time constant). For example, using a $V_{PASS}$ voltage of 4V, a single programming pulse of 1.2 milliseconds duration results in a 1.05V threshold shift in the H-cell, whereas using 60 pulses of 20 microsecond duration results in a 0.34V threshold shift, and using 240 pulses of 5 microsecond duration results in a 0.2V threshold shift.

Figure 9:
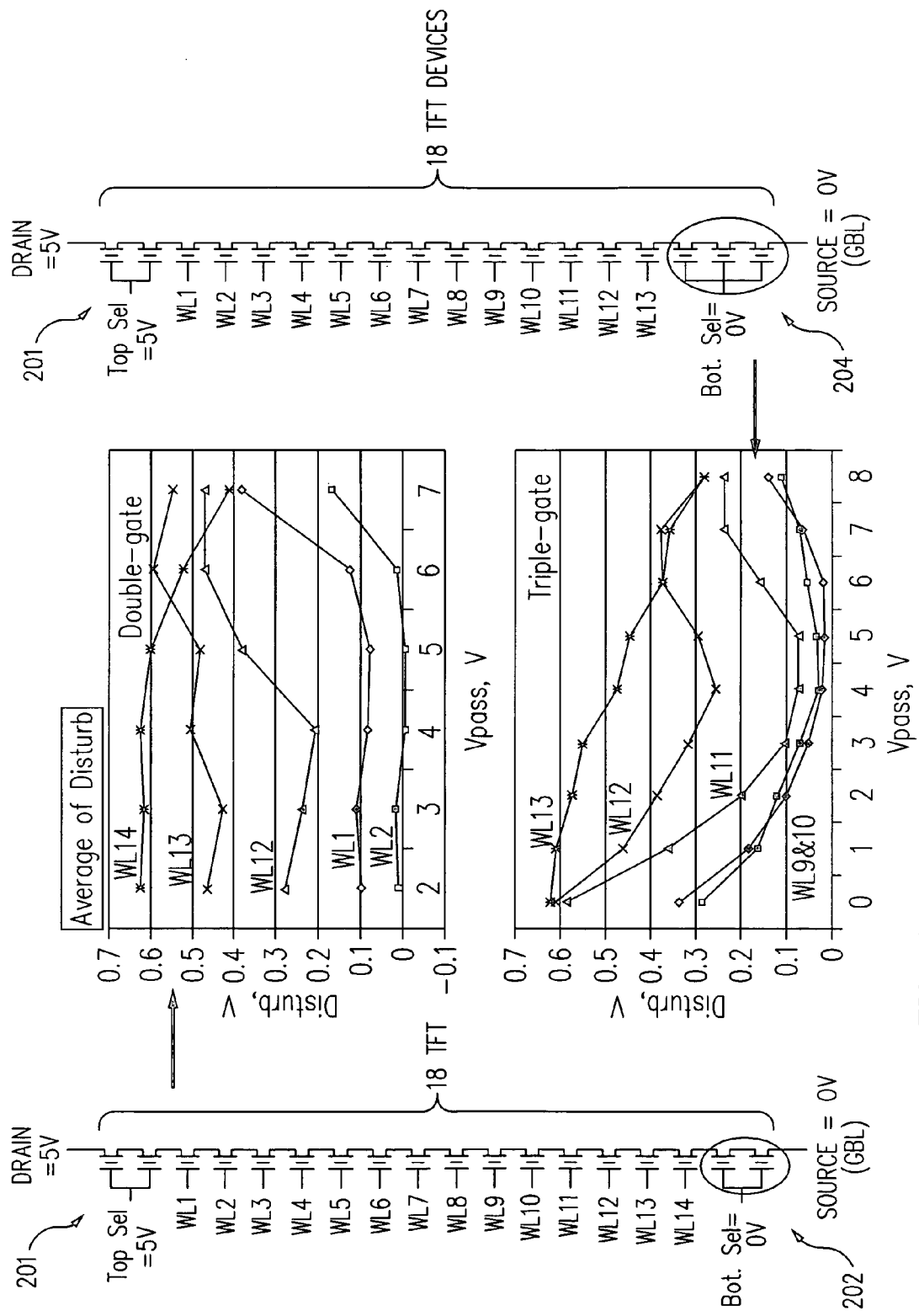
FIG. 9 is a graph depicting the amount of disturb programming of unselected memory cells in an unselected NAND string, relative to the passing voltage on unselected word lines, for a first NAND string utilizing two series select devices at the bottom of the string, and for a second NAND string utilizing three series select devices at the bottom of the string.

The field enhanced leakage current, particularly of TFT devices, may be reduced by using multiple series selection devices rather than a single selection device at one or both ends of a NAND string. FIG. 9 shows the effect of memory cell location on program disturb for an exemplary NAND string technology in a mirrored configuration using, in one case, two series selection devices at each end of the string, and in another case, three series selection devices at the bottom end of the string. The assumptions are again a string whose channels were initially biased to an inhibit voltage of 5V. The top selection devices 201 are off, and the bottom selection devices are biased assuming the global bit line is conveying a grounded bit line programming voltage to the adjacent NAND string. The graphs depicts the amount of disturb shift in H-memory cell threshold voltage as a function of the passing voltage $V_{PASS}$ presented to the unselected word lines during the programming pulse, for several different memory cell positions along a string of 18 total devices. In each case, a total of 240 programming pulses were applied. As may be observed, having three series section devices 204 results in reduced disturb programming compared to having only two such series selection devices 202. Also, memory cells closer to the bottom of a NAND string exhibit greater program disturb.

With multiple series selection gates, program disturb is further reduced albeit with a penalty of increasing die size because of the additional series devices needed on each string. Moreover, the string current, $I_{ON}$, will also be reduced (for a given size memory cell device and select device).

Figure 10:
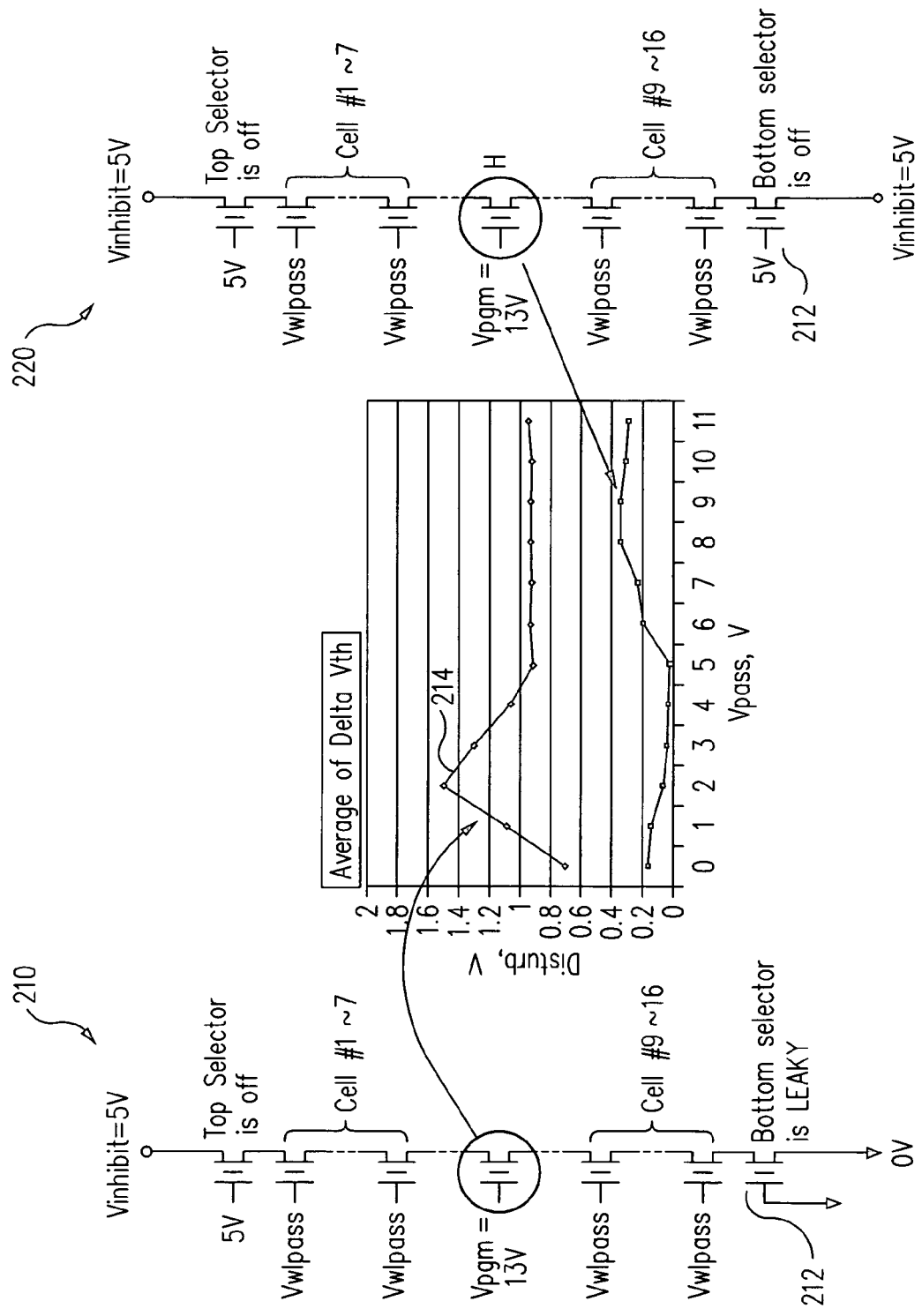
FIG. 10 is a graph depicting the amount of disturb programming of an unselected memory cell in an unselected NAND string, relative to the passing voltage on unselected word lines, for a first case corresponding to programming an adjacent NAND string, and for a second case corresponding to an inhibited NAND string, both cases utilizing a single select device at the bottom of the respective string.

While the previous two cases illustrated multiple series selection devices having the same voltage on both (or all three) of the series devices at an end of the NAND string, the leakage current may be further reduced by independently biasing the respective gate of each series device. Having ground on both gates does not result in the lowest leakage. Referring to FIG. 10, two cases are shown. The NAND string 210 on the left has a bottom selection device 212 biased with ground on its gate and ground on its source (corresponding to a programming voltage on the adjacent string in a mirrored configuration). The NAND string 220 on the right has a bottom selection device 222 biased with 5V on both its gate and source. The leakage current through the bottom selection device 212 is clearly seen in the graph 214 of disturb programming versus $V_{PASS}$ voltage. The grounded-gate device 212 has higher leakage current because of field enhanced leakage current which is caused by the high drain to source potential experienced on the bottom-most transistor. Although the inhibited NAND string 220 bottom select device 222 is biased acceptably with a voltage such as 5V on its gate (since its source is also at 5V), impressing a voltage such as 5V on the gate of the bottom access device on a selected NAND string is unacceptable because such a string may be coupled at its opposite end to ground (if the selected cell is to be programmed).

If multiple series selection devices are used, multiple gate voltages may be used to reduce the leakage current. One or more of the multiple select devices may have a higher voltage, such as 4V to 5V, on its gate in order to reduce field enhanced leakage current most effectively. Such a select device gate voltage may also be the same value as the $V_{PASS}$ voltage, but also may be set to a different value. At least one of the gates should be at a voltage lower than the Vt of the access device to shut off leakage current flowing into the selected string (e.g., for a mirrored arrangement). In certain preferred arrangements, the access device which has a grounded gate is the bottom one because its gate-to-source voltage is the least negative, and a more negative gate-to-source voltage would increase field enhanced leakage current. In certain mirrored embodiments, the "source voltage" at the bottom of a NAND string is the adjacent global bit line, which may be at either ground or a $V_{INH}$ voltage. For certain preferred embodiments, three series select devices may be used to reduce the leakage currents and provide for adequate disturb programming protection, especially for very scaled devices.

Figure 11:
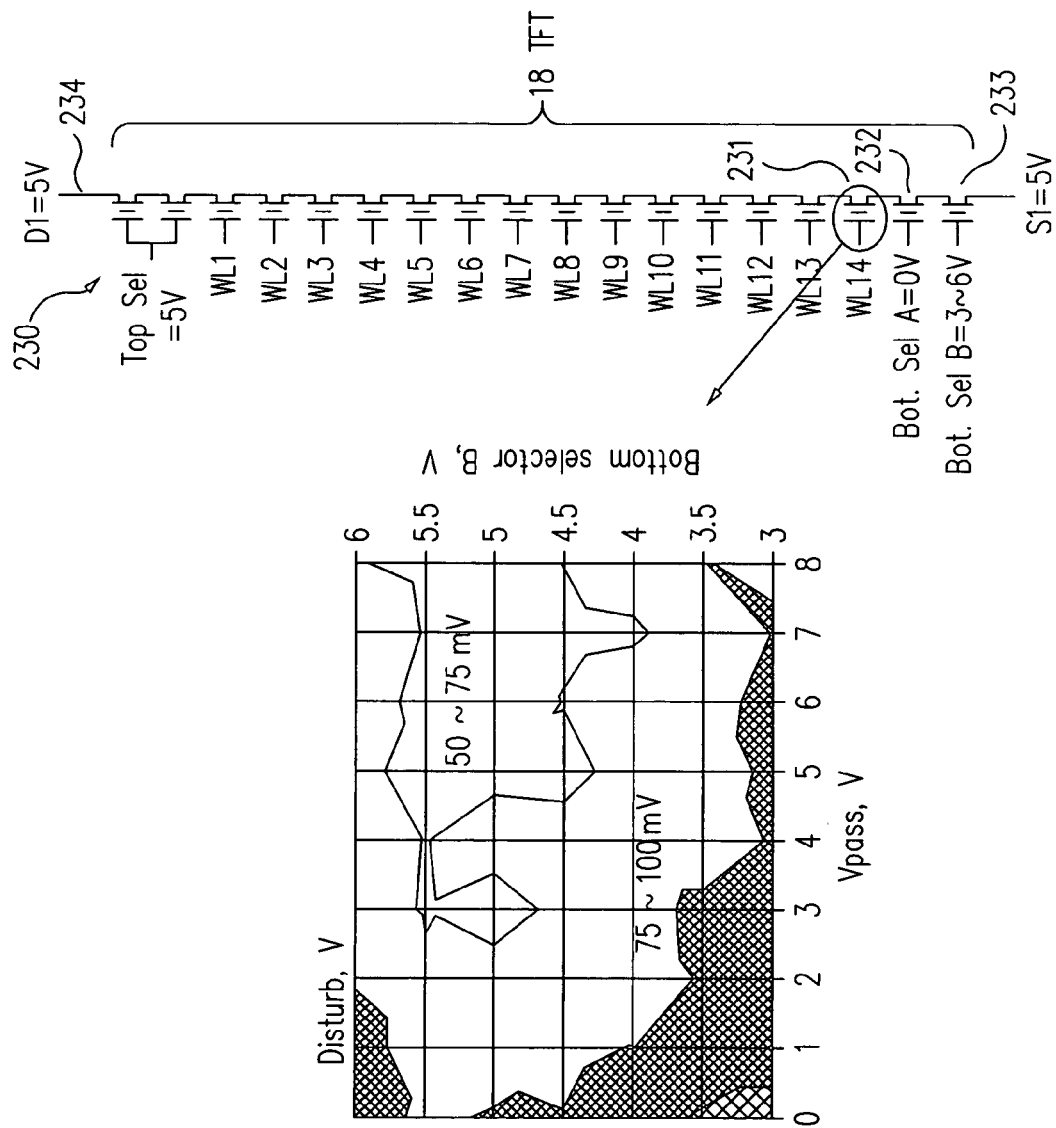
FIG. 11 is a graph depicting the amount of disturb programming of the bottom-most unselected memory cell in an unselected NAND string, relative to the passing voltage on unselected word lines and relative to the voltage of a bottom select device, for a NAND string utilizing multiple series select devices at the bottom of the string, each such device driven by a respective signal having different voltages.

FIG. 11 shows the program disturb of the last memory cell 231 as a function of the $V_{PASS}$ voltage and the gate voltage of the lower-most bottom selection device 233. The gate voltage of the upper-most bottom selection device 232 is held at ground, and the NAND string 230 is biased with an inhibit voltage $V_{INH}$ coupled to both ends of the string to inhibit programming. Very low disturb and wide programming conditions are achieved.

Figure 12:
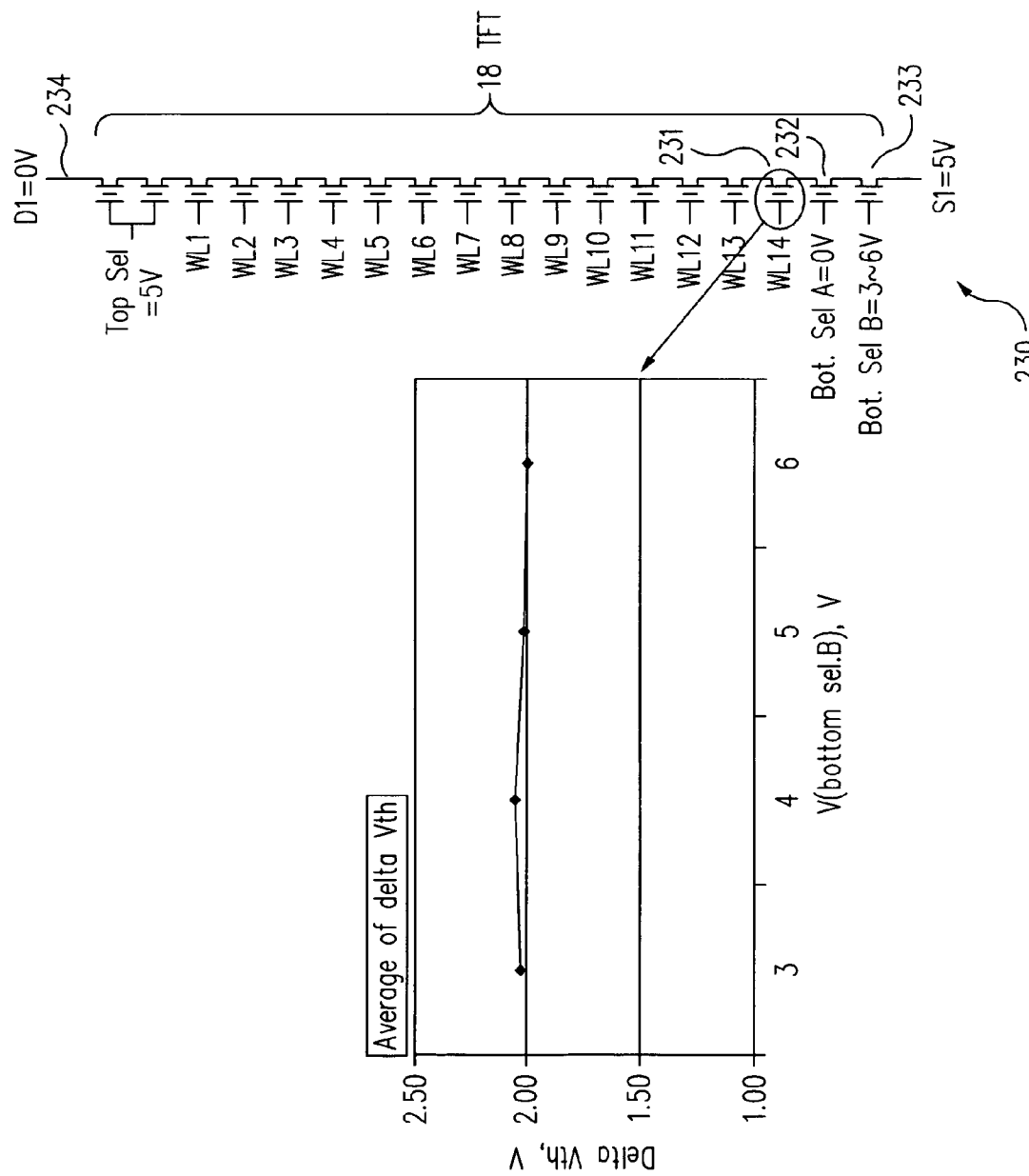
FIG. 12 is a graph depicting the amount of programming of the bottom-most selected memory cell in a selected NAND string, relative to the passing voltage on unselected word lines, for a NAND string utilizing multiple series select devices at the bottom of the string, each such device driven by a respective signal having different voltages.

FIG. 12 shows the programmability of the last memory cell 231 as a function of the gate voltage of the lower-most bottom selection device 233, when the NAND string 230 is biased for programming. The gate voltage of the upper-most bottom selection device 232 is held at ground, and the NAND string 230 is biased with a programming voltage of ground on the global bit line (i.e., node 234) coupled to the top end of the string, and the inhibit voltage $V_{INH}$ coupled to the bottom end of the string. As can be appreciated in FIG. 12, the programmability of the bottom-most cell 231 on the selected string 230 is not negatively affected by changes in the gate voltage of the lower-most bottom selection device 233.

Much of the previous description is phrased in the context of exemplary mirrored configurations, such as that shown in FIG. 2. Much of the nomenclature used in these figures and descriptions, however, may be applicable to non-mirrored configurations as well, such as that shown in FIG. 1. For example, the top end of the NAND string (i.e., the top select device(s)) has been generally used to correspond to the end of a NAND string coupled to an inhibit voltage, while the bottom end of the NAND string (i.e., the bottom select device(s)) generally correspond to a connection to an array line that may be biased at a low voltage, such as ground, that may cause an unintentional and unwanted leakage current flowing from the unselected NAND string into the array line.

Figure 13:
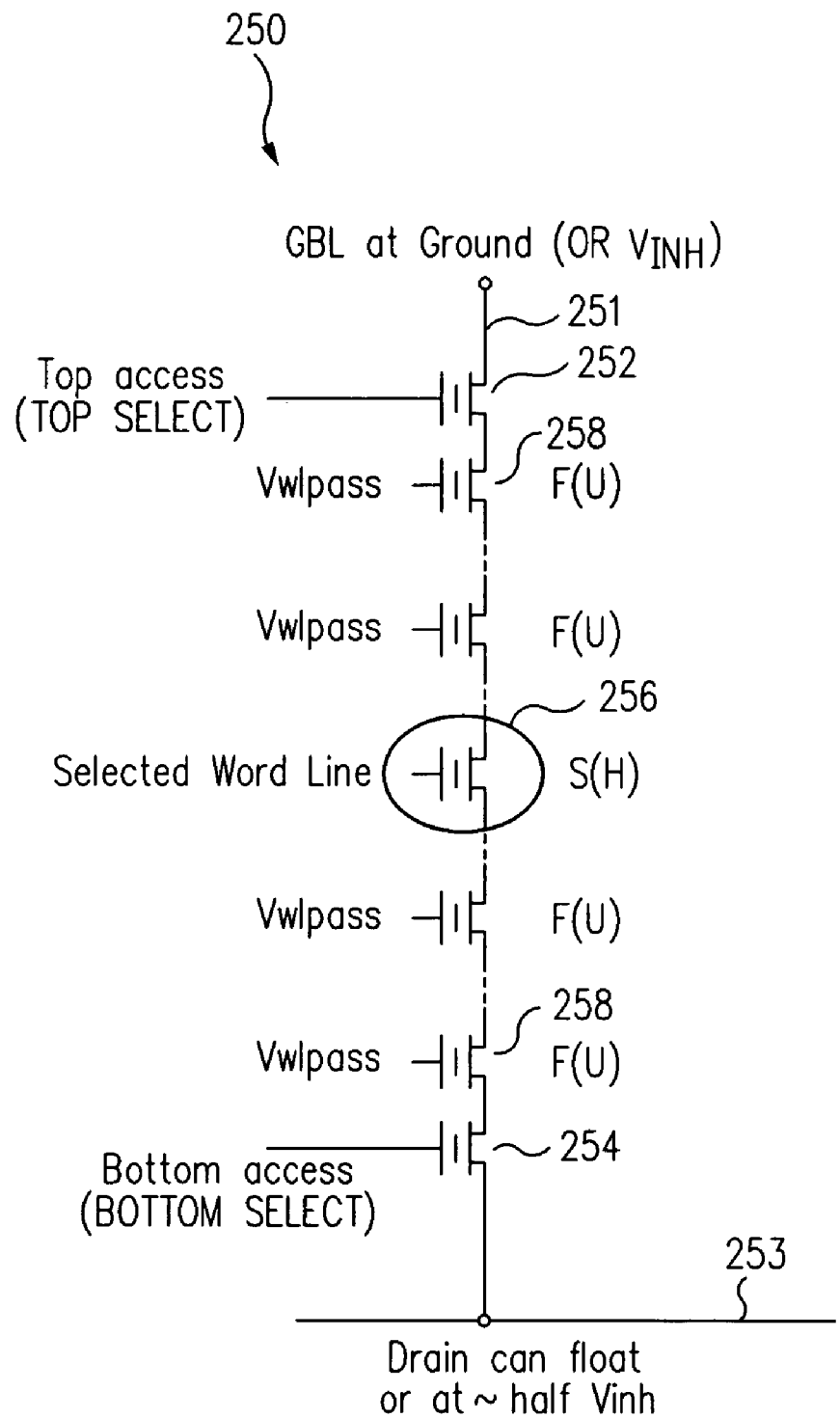
FIG. 13 is a schematic diagram representing a particular NAND string of a non-mirrored array.

Referring now to FIG. 13, a non-mirrored NAND string 250 is depicted. Here a single top access device 252 couples one end of the string to the global bit line 251, which may be at ground to program a cell when the string 250 is selected, or at the inhibit voltage $V_{INH}$ to inhibit programming in a selected or unselected NAND string. A single bottom access device 254 couples the other end of the string 250 to the global source line 253, which may be left to float during programming of a selected block, or preferably may be biased at an intermediate voltage between ground and the inhibit voltage, which intermediate voltage is more preferably approximately half of the inhibit voltage.

Figure 14:
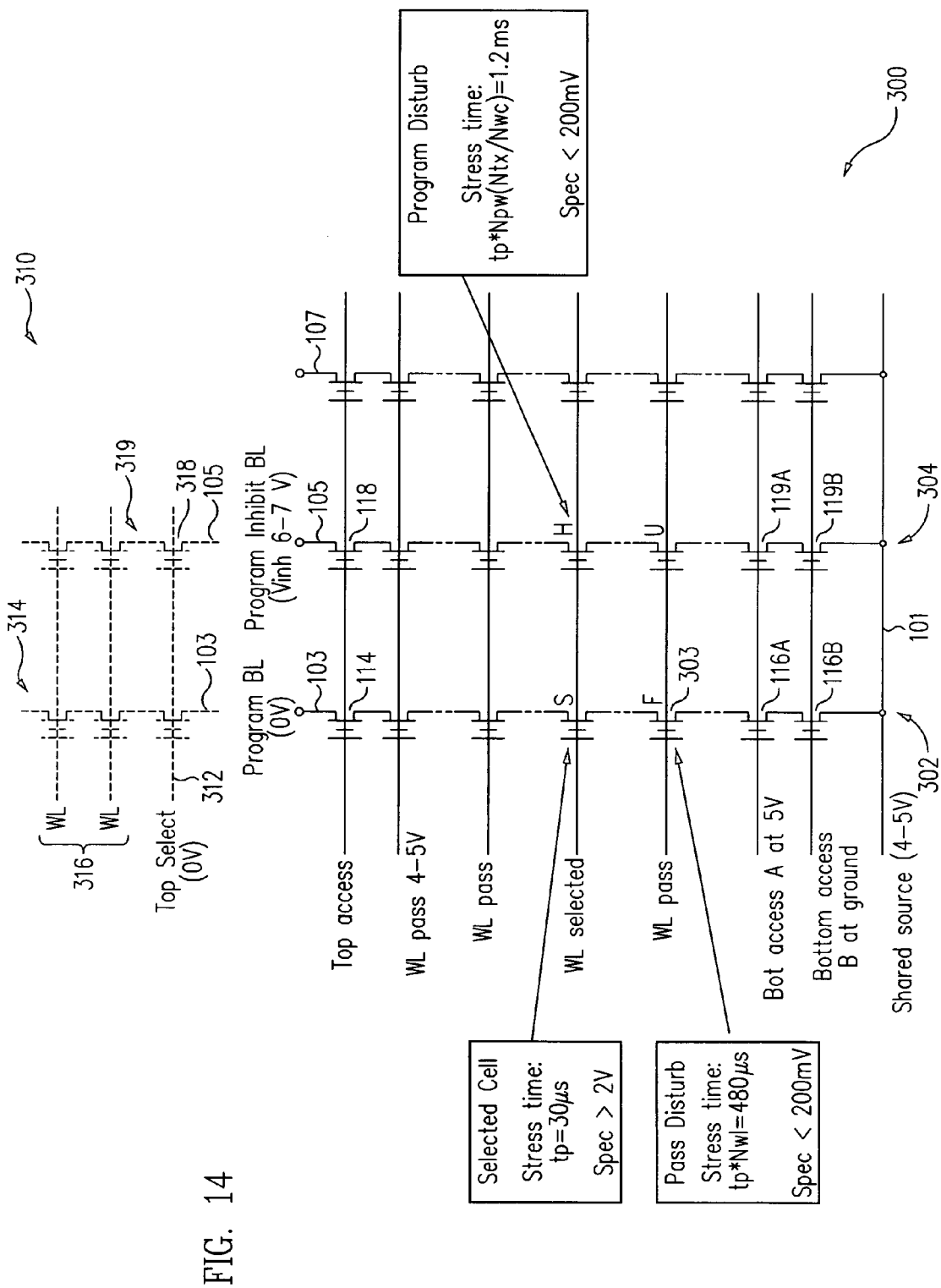
FIG. 14 depicts a portion of a non-mirrored NAND string memory array configuration incorporating multiple series selection devices at one end of each string, in accordance with certain embodiments of the present invention.

An improved embodiment is depicted in FIG. 14, which shows a non-mirrored string arrangement 300 (i.e., having adjacent strings connected to respective global bit lines at the same end), having a single block select device (also known as an array select device, or simply a select device) at the global bit line end of the strings (here shown as the top), and having multiple series select devices at the end opposite the global bit line end of the strings (here shown as two such select devices at the bottom end).

The top select devices 114, 118 do not play a significant role in the leakage prevention because they are on for both a programmed NAND string 302 and an inhibited NAND string 304. Therefore a single top select device may be used and still achieve best-case program disturb reduction of an inhibited NAND string and best-case programming of a programmed NAND string. The top select devices 114, 118 are needed for isolating the global bit line from unselected memory blocks also associated with the global bit line. Each unselected memory block (such as, for example, block 310) has a respective top select signal (e.g., select signal 312) which is preferably at ground to decouple each NAND string (e.g., NAND string 314) within the respective unselected memory block from their associated global bit lines. Moreover, the word lines in each unselected memory block (e.g., word lines 316) are also preferably at ground to keep such blocks inactive, powered-down, and unprogrammed. Since some global bit lines will be at the $V_{INH}$ voltage (to program cells within a selected block) the channels of the NAND strings in these unselected blocks could leak upward. However, this leakage is self-limiting because it reduces the drain-to-source voltage of the "leaky" select device (e.g., device 318) as the unselected NAND string begins to rise (e.g., channel node 319), while also decreasing the gate-to-source voltage of the select device, further limiting the leakage current. The potential for disturb of the first cell in the strings of these unselected blocks is minimal because the disturb is in the direction to reduce the Vt (the erase direction, since the source voltage is higher than the gate voltage) which is much slower than programming operations (at least for certain of the structures contemplated herein).

The inherent voltage drop that must be stopped by the "off" access devices at the bottom of the NAND strings is the difference between $V_{INH}$ plus the desired capacitive boosting of the H-channel, and the lowest possible global bit line voltage, which is ground (to program a cell). In a mirrored configuration this potential difference can occur across a single string, as described above. But in exemplary non-mirrored configurations the shortest path from a channel at the boosted $V_{INH}$ level to a global bit line at ground involves two NAND strings, as the path has to traverse through the shared source node at the bottom of the strings. Consequently, the total leakage current through the series combination of the bottom selection devices of an inhibited string (e.g., devices 119A, 119B) and the bottom selection devices of a programmed string (e.g., devices 116A, 116B) may be reduced by biasing the global source node 101 (i.e., shared source node) at an intermediate voltage. A shown, the shared source node is preferably driven to a bias voltage between ground and the $V_{INH}$ voltage, and more preferably is driven to approximately 4V–5V for an exemplary $V_{INH}$ voltage of 6–7V.

Because field enhanced leakage current is a possible concern to both the inhibited string and the selected string, it is desirable to use such an intermediate voltage rather than the $V_{INH}$ voltage on this shared source node 101. The preferred magnitude of the shared source node is chosen to balance the negative effects of leakage from an inhibited string and the negative effects of leakage into the programmed string. If the shared source node 101 is too low, the field enhanced leakage current flowing from the inhibited string 304, which is integrated during the relatively long program pulses, discharges the boosted level of the string. If the shared source node 101 is too high, leakage current may flow into the selected string 302 during a programming pulse, and result in a degraded program voltage (i.e., loss of a solid ground level) in the string, particularly for the bottom-most memory cell 303, which reduces the effective program voltage developed across the cell. This effect is less of a problem than the loss of boosted level, since this leakage current is small and, even with a high total resistance through the string, the other end is coupled to ground. Thus, the selected string 302 can tolerate some leakage, although preferably the gate of at least one of the bottom access devices 116A, 116B remains below the threshold voltage of the access device to be able to turn off such a device. In certain embodiments, the upper bottom select signal BOT ACCESS A is preferably above ground (e.g., approximately 5V), while the lower bottom access signal BOT ACCESS B is preferably ground. As such, the Select B signal being at ground shuts off the selected NAND string 302 leakage path, and the Select A signal at $V_{INH}$ in series with the Select B at Vss (i.e., ground) still shuts off the field enhanced leakage path sufficiently enough to allow self boosting on the unselected string 304. As with other embodiments described herein, this configuration performs better when multiple programming pulses are used, with multi-level pulses on the passing word lines and the top access signal, and may be used to achieve both sufficiently low disturb programming and low power programming. Preferably a large number of NAND strings within a select memory block are simultaneously programmed to reduce the accumulated disturb on inhibited strings. For example, 64 to 128 strings may be programmed at the same time within a memory block having, for example, 256 to 1024 NAND strings.

In certain embodiments, all the passing word lines of NAND strings within a selected block are driven with the same passing voltage or passing voltage waveform (which, as described herein, may be a multi-level waveform). In other embodiments, it may be desirable to drive the passing word lines "below" the selected word line (i.e., on the opposite side of the selected word line relative to the global bit line) with a lower voltage than those passing word lines "above" the selected word line. The programming voltage (e.g., ground) is still applied robustly to the selected memory cell because the "upper" unselected word lines (i.e., those between the selected memory cell and the select device(s) coupled to the global bit line) are driven with the higher $V_{PASS}$ voltage. But this arrangement reduces the F-cell programming stress on the lower memory cell devices (i.e., the so-called $V_{PASS}$ disturb stress). For embodiments incorporating mirrored NAND strings, the top of one NAND string is the bottom of its adjacent NAND string, and thus the top and bottom reverse 50% of the time, so that the F-cell stress is halved for all cells. For embodiments incorporating non-mirrored NAND strings, the respective bottom of each NAND string are aligned, and so cells toward the bottom would indeed see less $V_{PASS}$ stress than cells toward the top. Nevertheless, the bottom cells may be more susceptible to leakage-current induced H-cell program disturb (i.e., $V_{INH}$ disturb) when its NAND string is unselected (since they are closer to the end having the selection device(s) which may leak), and the boosting loss, even though reduced by these techniques, is not zero. As a result, non-mirrored NAND string arrays also benefit from the bottom cells getting less F-cell stress because these bottom cells can tolerate the higher H-cell stress without exceeding a total Vt change due to all disturb mechanisms.

In certain embodiments, a multi-level memory array includes memory cells formed on each of several memory planes or memory levels. NAND strings on more than one layer may be connected to global bit lines on a single layer. Such a global bit line layer is preferably disposed on a layer of a monolithic integrated circuit below all the memory levels for more convenient connection to support circuitry for the memory array, which may be disposed in the substrate below the array. In some embodiments such a global bit line layer may reside in the midst of the memory levels, or above the array, and more than one global bit line layer may be used. Moreover, the NAND strings on more than one layer may also be connected to shared bias nodes on a single layer, which preferably is disposed above all the memory levels. In some embodiments, the shared bias nodes may reside in the midst of the memory levels, or below the array. The shared bias nodes may likewise be disposed on more than one layer.

Since the non-mirrored NAND string arrangement depicted utilizes a global bit line for each adjacent NAND string, the pitch of global bit lines may be tighter than for other embodiments in which adjacent NAND strings share the same global bit line. To alleviate global bit line pitch problems, in certain embodiments global bit lines may be routed on two or more wiring layers. For example, even-numbered NAND strings may be associated with global bit lines disposed on one global bit line layer, while odd-numbered NAND strings may be associated with global bit lines disposed on another global bit line layer. Vias may be staggered to help match the pitch of NAND strings, and the required global bit line pitch relaxed to twice the pitch of individual NAND strings. Vertical vias that contact more than two vertically adjacent layers may also be used, particularly for three-dimensional arrays having more than one memory plane of NAND strings. Such a vertical connection may also be conveniently termed a "zia" to imply a via-type structure connecting more than one layer in the z-direction. Preferred zia structures and related methods for their formation are described in U.S. Pat. No. 6,534,403 to Cleeves, issued Mar. 18, 2003, the disclosure of which is hereby incorporated by reference in its entirety. Additional details of exemplary zias are described by Roy E. Scheuerlein, et al, in "Programmable Memory Array Structure Incorporating Series-Connected Transistor Strings and Methods for Fabrication and Operation of Same," referenced above.

A variety of embodiments are contemplated. Both mirrored and non-mirrored configurations, as described herein, are specifically contemplated. Additional sharing may be employed to further reduce the area required by any given block. For example, the contacts to the global bit lines in a non-mirrored configuration may be shared by two memory blocks, one on either side of the shared contacts. In addition, the shared drain line and its associated contacts to the end of NAND strings in one block may be shared by the NAND strings in the adjacent block. In other embodiments, adjacent blocks may have independent shared drain nodes to avoid stressing the unselected blocks.

Figure 17A:
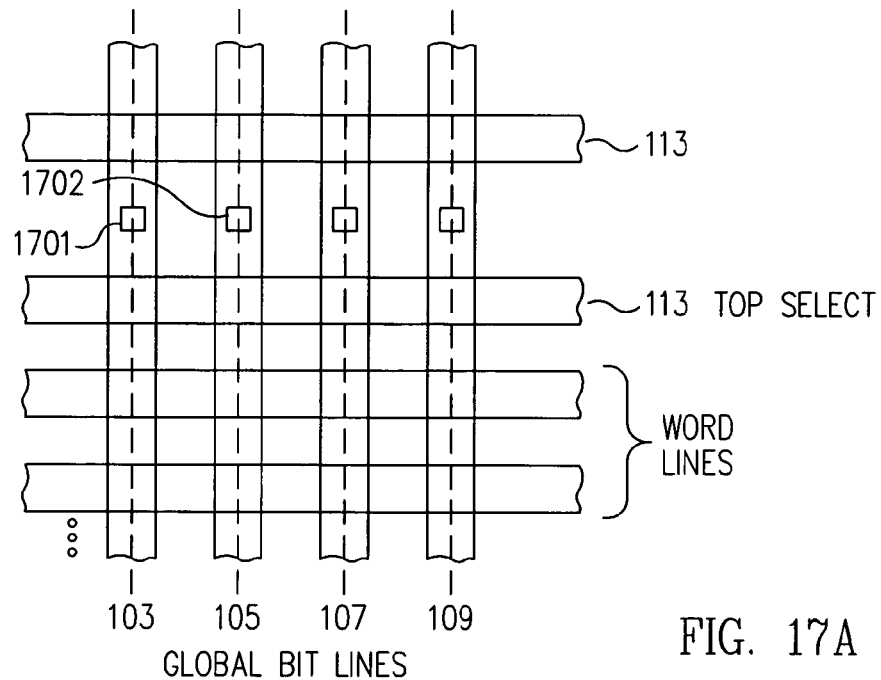
Figure 17C:
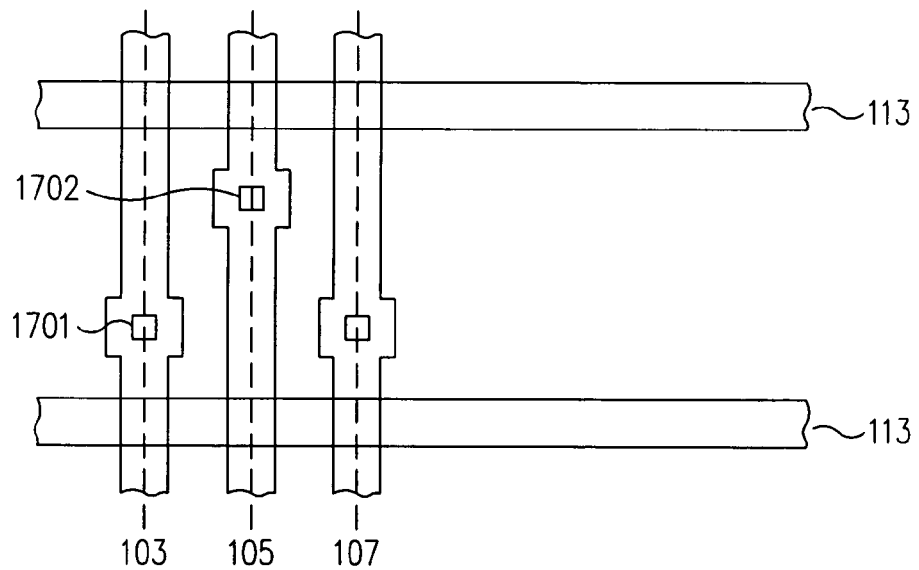
Figure 17D:
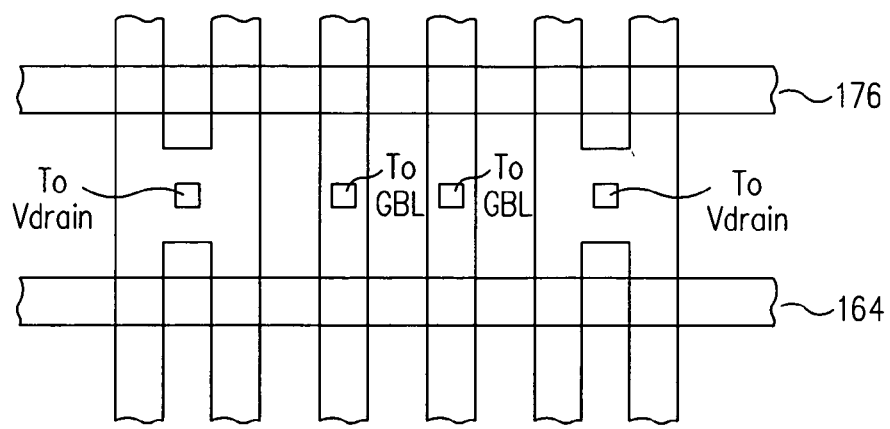
Figure 17E:
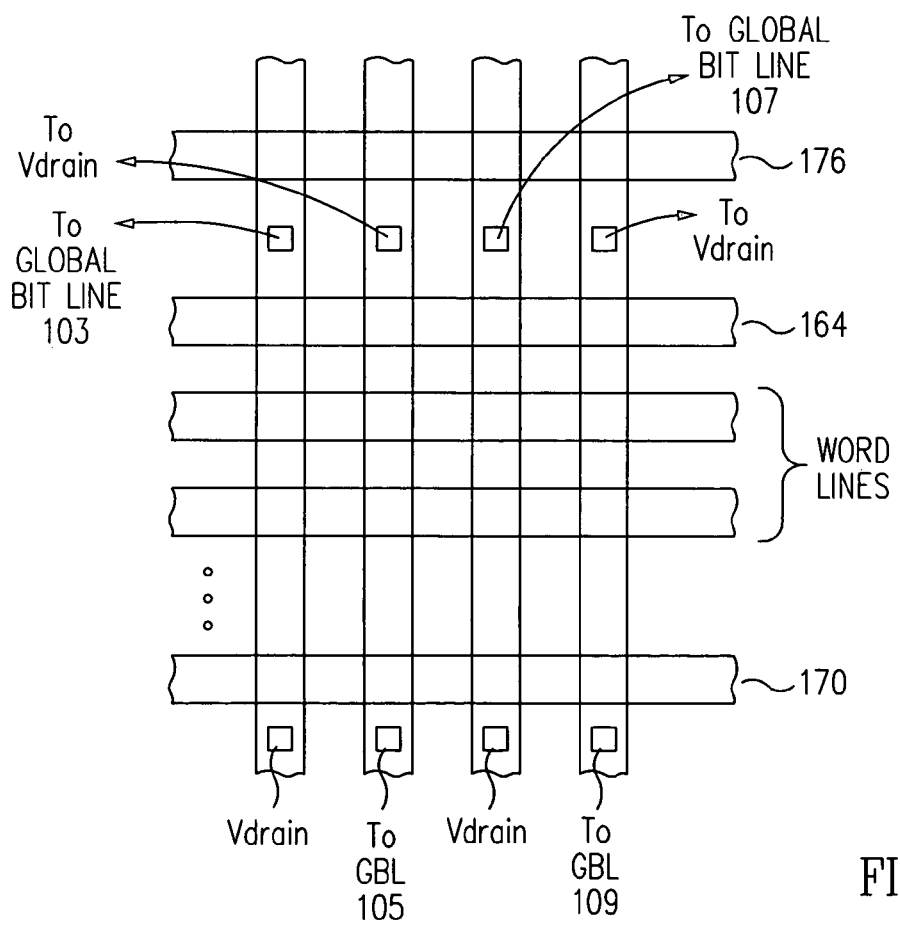

As shown in FIGS. 17A, 17B, 17D, and 17E, compact arrangements of zias in a straight line are preferred to save area for the contacts to the global bit lines. This is especially advantageous for the non-mirrored arrangement of NAND strings shown in FIGS. 17A, 17B and 17C. Any known processing technique for producing zias at a very tight spacing of the NAND channel regions can be used in combination with the NAND string arrangements shown in FIGS. 17A, 17B, 17D, and 17E. In FIG. 17A the non-mirrored NAND strings are connected to global bit lines on a single layer below the memory lines and coincident with the memory lines so they do not appear in the FIG. 17A plan view. Alternatively, zia 1701 could connect to global bit lines on one layer while adjacent zia 1702 could connect to global bit line on a second global bit line layer. A vertically overlapping zia technique that forms a zia connection from a common memory level to two wiring levels may be used advantageously to connect the NAND strings to global bit lines on two layers, as shown in arrangement 17B. Such vertically overlapping zia techniques are described in more detail in U.S. patent application Ser. No. 10/728,451 by Roy E. Scheuerlein, et al., entitled "High Density Contact to Relaxed Geometry Layers," filed on even date herewith, which application is hereby incorporated by reference in its entirety. The two global bit line layers can both be below the memory array or both above the memory array. In FIG. 17C, the zia locations are staggered to enlarge the spacing between the zia holes and in some embodiments provide for a pad region on the NAND string channel layers and global bit line layers. The use of in-line zias (as shown in FIG. 24, FIG. 25, and FIG. 28 of "Method for Fabricating Programmable Memory Array Structures Incorporating Series-Connected Transistor Strings," referenced above) can also provide a tighter spacing of zias in the arrangements shown in FIGS. 17A, 17B, 17D, or 17E, while connecting the zia to a NAND string in a selected block and a NAND string in an adjacent block. Multi-layer vertical zia holes (as shown in FIG. 29 of "Method for Fabricating Programmable Memory Array Structures Incorporating Series-Connected Transistor Strings," referenced above) form compact zias which are also suitable for each of these arrangements.

The global bit lines could be on one layer or on two layers, and above or below the memory layers.

The various techniques described herein, such as channel boosting, multiple programming pulses, multi-level pulses, and multiple series selection devices, may be used alone or in combination to reduce H-cell program disturb, F-cell program disturb, and to provide for robust S-cell programming.

For a mirrored configuration, a preferred embodiment uses three series selection devices on each end of each string, with two independent gate voltages for the top select group and two independent gate voltages for the bottom select group. Multi-level gate pulses are also used, with an initial pulse level of ($V_{INH}$+max Vt), followed by a reduced pulse level of ($V_{INH}$−min Vt), for both the top selector and the passing word lines. Multiple programming pulses are preferably used as well, all as summarized in the following table:

| $V_{INH}$ | Top selectors (3 gates) | $V_{PASS}$ | $V_{PGM}$ | Bottom selector (3 gates) | Common drain | H cell disturb | F cell disturb | total # of devices per string |
|---|---|---|---|---|---|---|---|---|
| 5 V | 7 V -> 4 V | 7 V -> 4 V | 13 V | Outer 2 gates shorted @ 0 V & inner 1 gate @ 4.5 V | 0 V | <250 mV | <200 mV | 22 |

A total of 22 devices are used per string: 16 memory cells; 3 series selection devices at the top of the string; and 3 series selection devices at the bottom of the string. The multi-level pulses on passing word lines and the top selection devices are initially 7V, and then brought down to 4V before the programming pulse is applied to the selected word line.

For a non-mirrored configuration, one preferred embodiment uses a single selection device on the top end of each string (i.e., the global bit line end), and two series selection devices on the bottom end of each NAND string, with two independent gate voltages for the bottom select group. Multi-level gate pulses are also used, with an initial pulse level of ($V_{INH}$+max Vt), followed by a reduced pulse level of ($V_{INH}$−min Vt), for both the top selector and the unselected word lines. Multiple programming pulses are preferably used as well, as summarized in the following table:

| $V_{INH}$ | Top selectors 1 gate | $V_{PASS}$ | $V_{PGM}$ | Bottom selector (2 gates) | Source (GSL) | H cell disturb | F cell disturb | total # of devices per string |
|---|---|---|---|---|---|---|---|---|
| 5 V | 7 V -> 4 V | 7 V-> 4 V | 13 V | outer gate @ 5 V & inner gate @ 0 V | 2.5 V | <75 mV | <100 mV | 19 |

Figure 18:
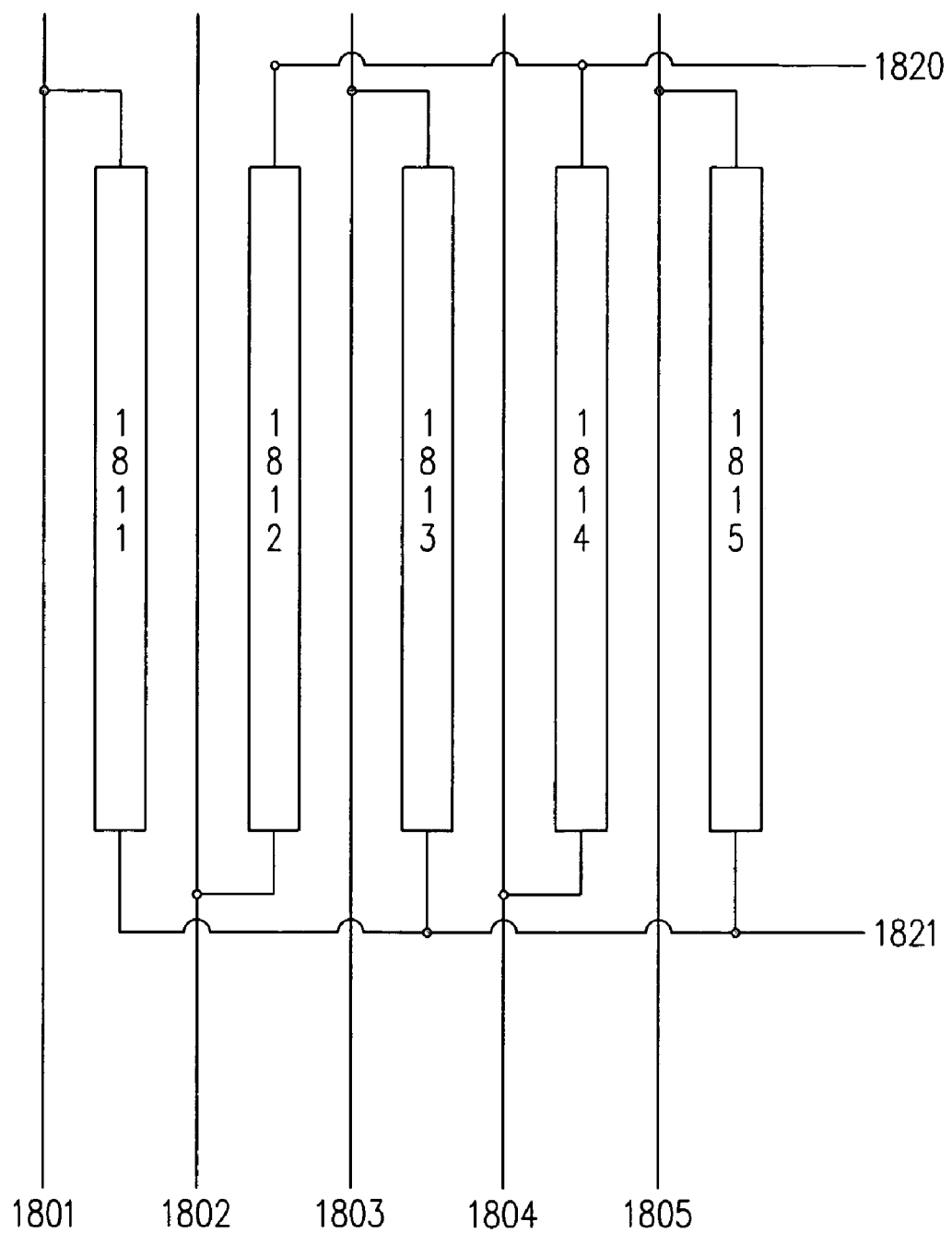
FIG. 18 depicts an arrangement of a mirrored NAND string arrangement having two shared drain lines for a memory block.

As shown in FIG. 18, a mirrored string arrangement 1800 in a selected block of NAND strings has all adjacent NAND strings 1811, 1812, 1813, 1814, 1815 connected to corresponding global bit lines 1801, 1802, 1803, 1804, 1805 but at alternating sides of the memory block. The drain bias node 1820 at the top and the drain bias node 1821 at the bottom may be biased independently of the global bit line voltages and at a preferred voltage for reducing leakage current from the stings as in non-mirrored NAND string arrangements.

A total of 19 devices are preferably used per string: 16 memory cells; 1 selection device at the top of the string; and 2 series selection devices at the bottom of the string. The multi-level pulses on passing word lines and the top selection devices are initially 7V, and then brought down to 4V before the programming pulse of is applied to the selected word line.

In certain non-mirrored embodiments, each NAND string may include only a single select device at each end thereof, as depicted in FIG. 1. Suitable performance may be achieved using a preferable set of operating conditions is described in the following table, which indicates voltage ranges for the various signals in the array. The "Value" column indicates a preferred value.

| Signal | READ | | PROGRAM | | ERASE | |
|---|---|---|---|---|---|---|
| | Value | Range | Value | Range | Value | Range |
| $V_{WL}$ | 1 V | 0 V . . . 3 V | 12 V | 7 V . . . 15 V | 0 V | 0 V |
| $V_{WLPASS}$ | 5 V | 2 V . . . 6 V | 7 V | 2 V . . . 9 V | 0 V | 0 V |
| $V_{WLUNSEL}$ | 0 V | 0 V or Floating | 0 V | 0 V or Floating | 10 V | 6 V . . . 13 V or Floating |
| $V_{BSELB}$ | 5 V | 2 V . . . 6 V | 5 V | 4 V . . . 10 V | 10 V | 6 V . . . 13 V |
| $V_{BSELD}$ | 5 V | 2 V . . . 6 V | 0 V | −3 V . . . 0 V | 10 V | 6 V . . . 13 V |
| $V_{UNBSEL}$ | 0 V | −3 V . . . 0 V | 0 V | −3 V . . . 0 V | 10 V | 6 V . . . 13 V |
| $V_{GBL}$ | 1 V | 0 V . . . 3 V | 0 V/4 V | 0 V/4 V . . . 10 V | 10 V | 6 V . . . 13 V |
| $V_{DRAIN}$ | 1.5 V | 0 V . . . 3 VV | 4 V | 4 V . . . 10 V or Floating | 10 V | 6 V . . . 13 V |

In certain embodiments, the shared drain line may be common for all memory blocks. In other embodiments, this common node (also described herein as a global source line for non-mirrored configurations) may be split into multiple nodes, and each independently biased. As many unselected NAND strings are connected to the same wordline (usually Nst=128 to 1024 (512 typ.) multiplied by the number of layers, Nla=2 to 8 (8 typ.)), the leakage of all the "off" block select transistors (Nst*Nla) is superimposed to the read current of an erased cell. Indicating with Ibsleak the leakage of an unselected string, with Icer the current of an erased cell and with Icpgm the current of a programmed cell, in order to correctly distinguish an erased cell from a programmed cell, the following equation must be satisfied:

$$I_{cer} > Ratio(I_{bsleak} N_{st} N_{la} + I_{cpgm}) \rightarrow I_{bsleak} < \frac{\frac{I_{cer}}{Ratio} - I_{cpgm}}{N_{st} N_{la}} \cong 1 \text{ pA}$$

With typical values of Ratio=100, Icer=500 nA, Icpgm=1 nA, Nst=512, and Nla=8.

If the block select transistors leak more than the limit set by the equation above, the number of strings, Nst, may be reduced. The drawback of this is that the array efficiency gets worst, as every time the array is broken, inefficiencies are introduced. Alternatively, the common bias node may be split into multiple nodes. The $V_{DRAIN}$ that contains the selected string may be biased at a normal $V_{DRAIN}$ voltage (e.g., 1.5V). All the other $V_{DRAIN}$ nodes may be biased at the same voltage as the global bit lines. In this way, even if the block select devices are leaky, no current can flow in the unselected strings with $V_{DRAIN}$ at 1V, since there is no voltage difference across the strings. If the common node is split M times (i.e., into M individual nodes), the requirement on Ibsleak is reduced by a factor of M with respect to the limit above, without having to break the global bit line. A preferable value of M can be 128, giving a limit for Ibsleak of 150 pA. The range for M is preferably 16 to 512, depending on the block select transistor leakage.

The read biasing conditions described above set the global bit lines as sources and the common node as a drain. The opposite is also possible; reversing the bias conditions of the two (e.g., the global bit lines at 1.5V and the common node at 1V).

A possible variation to relax the requirement of having on-pitch zias on every layer is to share the zias for two strings. This implies having strings pointing in opposite direction, like the adjacent string depicted in FIG. 2. In other embodiments, rather than having on-pitch zias, another routing layer (R4) may be introduced on top of the memory array. Such a routing layer would carry half of the global bit lines, while the other global bit line layer would carry the other half of the global bit lines.

As described above, for many memory arrays, and especially for a three-dimensional (3D) memory, utilizing depletion mode devices when erased and near depletion mode devices (i.e., around one volt $V_T$, such as, for example, 0.5 to 1.5V) when programmed has a great advantage in simplifying the layout complexity for each of the memory layers, as described herebelow. Moreover, utilizing near depletion mode devices when programmed reduces the voltages that need to be applied to the unselected word lines when reading a selected memory cell. The cell current can pass more easily through the string even if unselected memory cells are programmed. This voltage reduction is beneficial for reducing disturb effects during the many expected read cycles. For example, an unselected memory cell on an unselected NAND string which is erased could be slowly disturbed to a programmed stated by higher voltages on the word lines.

Figure 15:
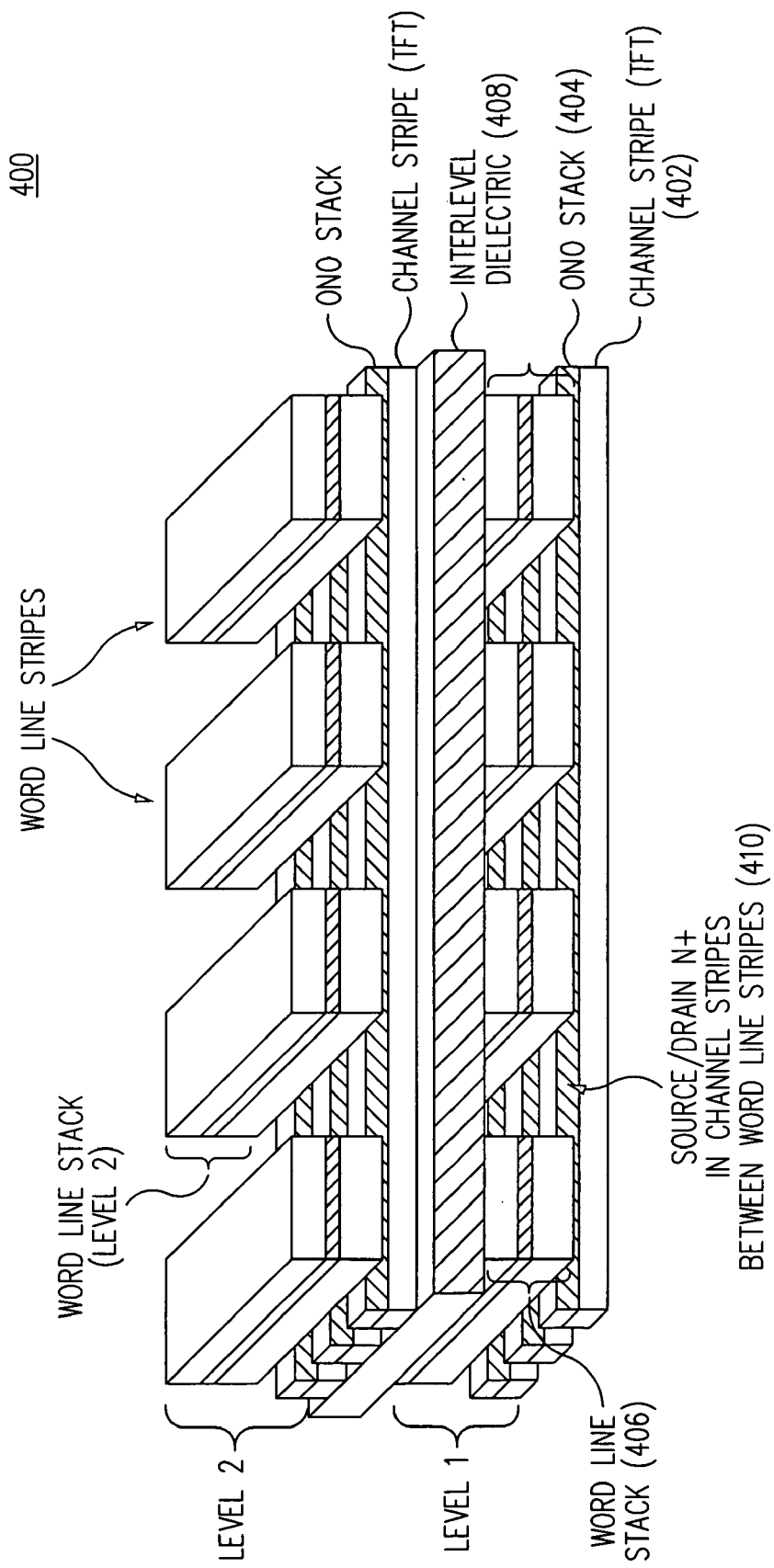
FIG. 15 is a perspective view of a multi-level array structure useful for embodiments of the present invention, showing series-connected NAND strings of SONOS memory cell devices.

NAND strings in accordance with the present invention may be fabricated using any of a number of different processes. An integrated circuit may include a memory array having a single memory plane, or may include a memory array having more than one memory planes. One exemplary structure is depicted in FIG. 15. A three-dimensional view is shown conceptually depicting a portion of a two-level memory array 400 in accordance with the present invention. On level 1, a plurality of channel stripes (e.g., 402) is formed in a first direction. A stored charge dielectric layer 404, such as an oxide/nitride/oxide (ONO) stack, is formed at least on the top surface of the channel stripes 402. A plurality of gate stripes (e.g., 406) running in a second direction different than the first direction is formed on the stored charge dielectric layer 404. Preferably the gate stripes, also called word line stripes, run generally orthogonally to the channel stripes. A source/drain region (e.g., 410) is formed in the channel stripes in the exposed regions between the word line stripes (i.e., not covered by a word line stripe), thus forming a series-connected string of thin-film transistors (TFT).

Such channel stripes 402 are preferably formed by depositing an amorphous silicon layer and etching the layer using a channel mask to form the channel stripes and annealing the layer to form a thin film transistor channel. The word line stripes 106 may be formed of a stack of more than one layer, such as a polysilicon layer covered by a silicide layer, or may be a three level stack, as shown in the figure.

An interlevel dielectric layer 408 is formed above the word line stripes to isolate the word lines on one level (e.g., word line stripes 406 depicted on level 1) from the channel stripes on the next higher level (e.g., channel stripes 402 depicted on level 2). A dielectric may also be used to fill spaces between the word line stripes of a given level. As can be appreciated, such a structure forms a plurality of series-connected transistors within each channel stripe 402.

The transistors of such a NAND string may be fabricated to contain enhancement or depletion mode devices for the programmed state. In other types of NAND memory arrays using floating gate devices (rather than SONOS devices), the erased state is often a zero-volt threshold voltage ($V_T$) or even a depletion mode $V_T$. A floating gate device can have a wide range of $V_T$'S because the floating gate can store a wide range of charge levels. Such a depletion mode programmed state is described in "A Negative Vth Cell Architecture for Highly Scalable, Excellently Noise-Immune, and Highly Reliable NAND Flash Memories" by Takeuchi et al., in IEEE JSSC, Vol. 34, No. 5, May 1999, pp. 675–684.

The descriptions herein have focused on the programming of memory cells, and have not addressed reading or erasing operations. In exemplary configurations, a selected NAND string is generally read by impressing a voltage across the NAND string, ensuring that both groups of one or more block select devices are biased to pass a current, ensuring that all non-selected memory cell devices in the NAND string are biased to pass a current through the string irrespective of the data state stored therein, and biasing the selected word line so that current flows through the NAND string for only one of the two data states. All the memory cells in a selected block may be erased by impressing a sufficiently high magnitude negative gate-to-source voltage across each memory cell transistor. For example, the global bit lines, any shared bias nodes, all block select lines, and all word lines may be driven to an erase ($V_{EE}$) voltage of, for example, 10 volts. After allowing time for the intermediate nodes in the selected block to charge to substantially the erase voltage conveyed on the global bit lines and shared drain nodes, the word lines in the selected block are brought to ground to impress an erase bias across each memory cell in the block. Additional details of both reading and erasing mirrored configurations are described in "Programmable Memory Array Structure Incorporating Series-Connected Transistor Strings and Methods for Fabrication and Operation of Same," by Roy E. Scheuerlein, et al, already referenced above, and analogous techniques may be employed for non-mirrored configurations.

One or more of the block select devices in embodiments described herein may be biased at times with a negative gate-to-source voltage. This puts a partial erase bias on such a block select device. If these block select devices are formed by the same process steps as a programmable cell, such as a depletion mode SONOS cell, these block select devices can get partially "erased" by this bias voltage applied during programming of a selected memory cell, which would slowly decrease the $V_T$ of the block select devices into a negative region after a number of program cycles. Such a threshold voltage may prevent the block select device from being turned off.

One could use extra processing to remove the charge storage dielectric layer (e.g., nitride) from the block select devices, or to fabricate another type of select device different than the memory cell device, but this adds complexity to the semiconductor process. Alternatively, a post-programming biasing condition is preferably added at the end of each program cycle, where the affected block select device is "programmed" a small amount to bring its $V_T$ back up to its maximum of, for example, about 0 volts. This may be accomplished by returning all the word lines in a selected block back to ground (0 volts), taking the global bit lines and shared drain nodes (or global source node) to ground, and driving the respective select signal to the programming voltage for a short time. For convenience, all the block select signals may be driven to the programming voltage as there is little concern for over-programming the threshold of the block select devices. For an exemplary SONOS process, the erase time is much longer than the programming time, so that even a relatively short "block select $V_T$ adjust program time" is adequate to ensure that its $V_T$ stays at its maximum. An exemplary duration of time for such a block select $V_T$ adjust is approximately 1 µs.

Figure 16:
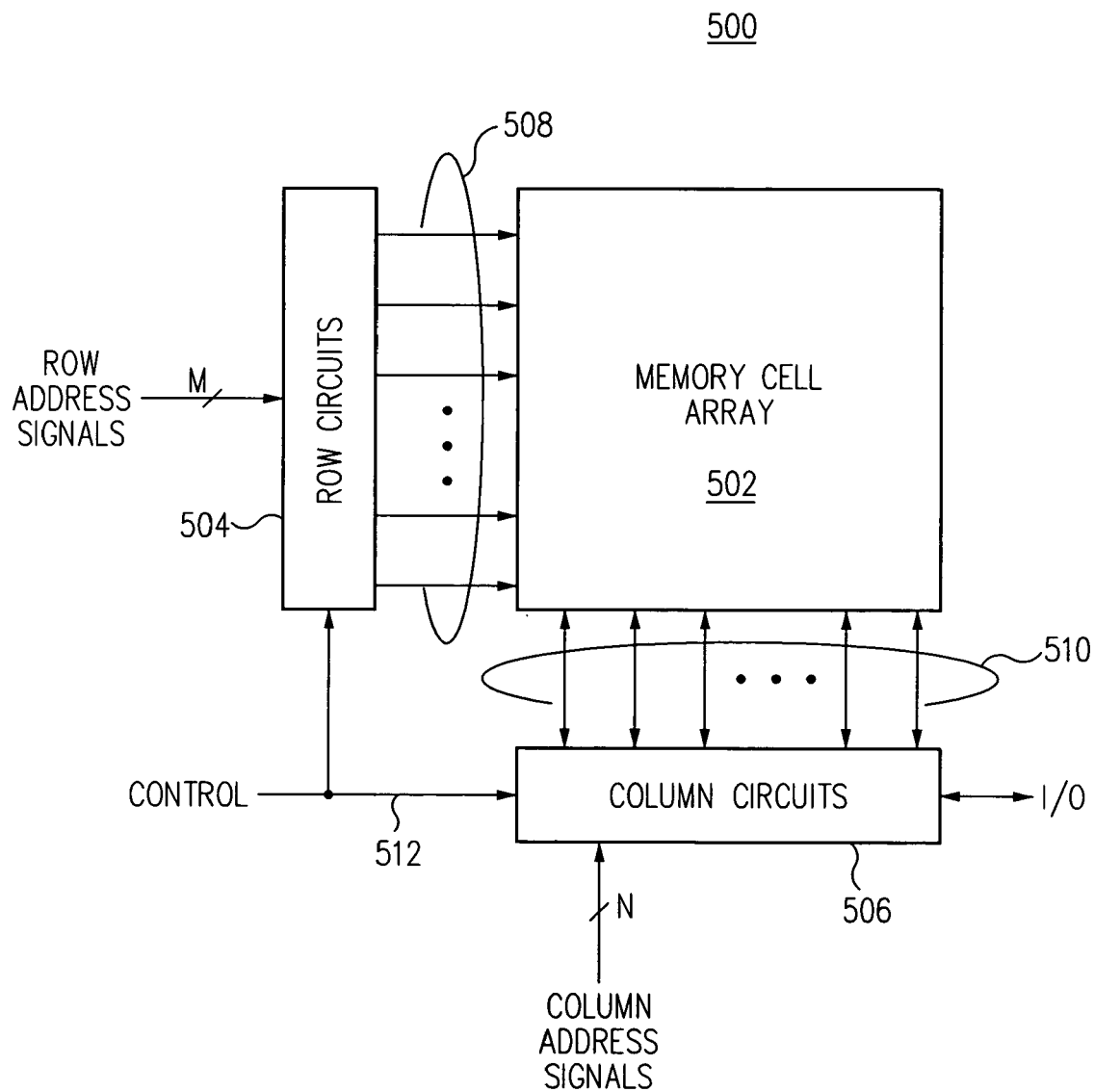
FIG. 16 is a block diagram of an integrated circuit incorporating a memory array in accordance with the present invention.

Referring now to FIG. 16, a block diagram is shown of an integrated circuit 500 including a memory array 502, which diagram may be useful to represent various embodiments of the present invention. In one such embodiment, the memory array 502 is preferably a three-dimensional, field-programmable, non-volatile memory array having more than one plane (or level) of memory cells. The array terminals of memory array 502 include one or more layers of word lines organized as rows, and one or more layers of global bit lines organized as columns. A group of word lines, each residing on a separate layer (i.e., level) and substantially vertically-aligned (notwithstanding small lateral offsets on some layers), may be collectively termed a row. The word lines within a row preferably share at least a portion of the row address. Similarly, a group of global bit lines, each residing on a separate layer and substantially vertically-aligned (again, notwithstanding small lateral offsets on some layers), may be collectively termed a column. The global bit lines within a column preferably share at least a portion of the column address.

The integrated circuit 500 includes a row circuits block 504 whose outputs 508 are connected to respective word lines of the memory array 502. The row circuits block 504 receives a group of M row address signals, various control signals 512, and typically may include such circuits as row decoders and array terminal drivers for both read and write (i.e., programming) operations. The row circuit block can also include circuits for controlling the block select lines and shared drain bias lines to determine block selection by some of the M row address signals. The integrated cirouit 500 also includes a column circuits block 506 whose input/outputs 510 are connected to respective global bit lines of the memory array 502. The column circuits block 506 receives a group of N column address signals, various control signals 512, and typically may include such circuits as column decoders, array terminal receivers, read/write circuitry, and I/O multiplexers. Circuits such as the row circuits block 504 and the column circuits block 506 may be collectively termed array terminal circuits for their connection to the various terminals of the memory array 502.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

While any of a variety of semiconductor processes may be advantageously utilized to fabricate memory arrays having NAND strings, many embodiments described above contemplate memory cells formed as thin film transistors above a semiconductor substrate. Preferred methods for fabricating such memory arrays are described in: U.S. application Ser. No. 10/334,649, filed on Dec. 31, 2002, by Andrew J. Walker, et al., entitled "Formation of Thin Channels for TFT Devices to Ensure Low Variability of Threshold Voltages," which application is hereby incorporated by reference; U.S. application Ser. No. 10/079,472, filed on Feb. 19, 2002, by Maitreyee Mahajani, et al., entitled "Gate Dielectric Structures for Integrated Circuits and Methods for Making and Using Such Gate Dielectric Structures," which application is hereby incorporated by reference; U.S. application Ser. No. 10/335,089 by Andrew J. Walker, et al, entitled "Method for Fabricating Programmable Memory Array Structures Incorporating Series-Connected Transistor Strings," filed on Dec. 31, 2002, which application is hereby incorporated by reference in its entirety; and U.S. application Ser. No. 10/668,693 by Maitreyee Mahajani, et al, entitled "Storage Layer Optimization of a Non Volatile Memory Device," filed on Sep. 23, 2003, which application is hereby incorporated by reference in its entirety. Other useful fabrication methods are described in U.S. patent application Ser. No.10/728437 by James M. Cleeves, et al., entitled "Optimization of Critical Dimensions and Pitch of Patterned Features In and Above a Substrate," filed on even date herewith, which application is hereby incorporated by reference in its entirety, and described in U.S. patent application Ser.No. 10/728,436 by Yung-Tin Chen, entitled "Photomask Features with Interior Nonprinting Window Using Alternating Phase Shifting," filed on even date herewith, which application is hereby incorporated by reference in its entirety.

As used herein, a series-connected NAND string includes a plurality of devices connected in series and sharing source/drain diffusions between adjacent devices. As used herein, a memory array may be a two dimensional (planar) memory array having a memory level formed in a substrate, or alternatively formed above the substrate. The substrate may either be a monocrystalline substrate, such as might include support circuitry for the memory array, or may be another type of substrate, which need not necessarily include support circuitry for the memory array. For example, certain embodiments of the invention may be implemented utilizing a silicon-on-insulator (SOI) structure, and others utilizing a silicon-on-sapphire (SOS) structure. Alternatively, a memory array may be a three-dimensional array having more than one plane of memory cells (i.e., more than one memory level). The memory levels may be formed above a substrate including support circuitry for the memory array. As used herein, an integrated circuit having a three-dimensional memory array is assumed to be a monolithic integrated circuit, rather than an assembly of more than one monolithic integrated circuit.

The present invention is contemplated for advantageous use with any of a wide variety of memory array configurations, including both traditional single-level memory arrays and multi-level (i.e., three-dimensional) memory arrays, and particularly those having extremely dense X-line or Y-line pitch requirements. Moreover, the invention is believed to be applicable to memory array having series-connected NAND strings which utilize modifiable conductance switch devices as memory cells, and is not to be limited to memory cells incorporating a charge storage dielectric. Such modifiable conductance switch devices are three-terminal devices whose conductance between two of the terminals is modifiable, and further is "switched" or controlled by a signal on the third or control terminal, which is generally connected to the word lines (or to the block select lines, for some embodiments). The conductance may be modified post-manufacture (i.e., by programming using a tunneling current; by programming using a hot electron current, etc). The modifiable conductance frequently is manifested as a modifiable threshold voltage, but may be manifested as a modifiable transconductance for some technologies.

Another exemplary memory array may implement NAND strings of "polarizable dielectric devices" such as Ferroelectric devices, where the device characteristics are modified by applying a voltage on the gate electrode which changes the polarization state of the Ferroelectric gate material.

Another exemplary memory array may implement NAND strings of programmable devices utilizing a floating gate, where the device characteristics are modified by applying a voltage on a control gate electrode which causes charge to be stored onto the floating gate, thereby changing the effective threshold voltage of the device.

Yet another exemplary memory array may implement NAND strings of so-called "single electron" devices or "coulomb blockade" devices, where applied voltages on the word line change the state of electron traps formed by silicon nanoparticles or any quantum well structure in the channel region by which the conduction characteristics of the NAND string devices are changed. In some embodiments, the structure of the charge storage region of the NAND string devices could also be located in a nanometer sized (i.e., from 0.1 to 10 nanometers) silicon filament formed at the source or drain edges of the gate structure to modify the device characteristic. Other alternative embodiments may utilize an organic conducting layer for the channel region and form organic material devices in a NAND string whose conductive state is selectively changed by applying an appropriate voltage to the word lines.

Thus, while the embodiments described in detail above utilize charge storage dielectric such as an ONO stack, other memory cells such as a floating gate EEPROM programmed threshold devices, polarizable dielectric devices, single electron or coulomb blockade devices, silicon filament charge storage devices, and organic material devices are also contemplated. Moreover, the invention is not limited to memory arrays having positive programming voltages, but is useful for other cell technologies which may require negative programming pulses. Some of the alternative cell structures allow lower programming voltage. Embodiments with these lower voltage cells would have proportionally reduced voltages for the various line nodes such as $V_{PASS}$ and $V_{INH}$ as appropriate to the given cell type.

In various embodiments of the invention described herein, the memory cells may be comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an antifuse memory cell is preferred. Other types of memory arrays, such as MRAM and organic passive element arrays, may also be used. MRAM (magnetoresistive random access memory) is based on magnetic memory elements, such as a magnetic tunnel junction (MTJ). MRAM technology is described in "A 2556 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

Moreover, while the embodiments described in detail above provide two conductance values corresponding to two different data states, and thus provide for storing one bit of information per memory cell, the invention may also be utilized to provide more than one bit per memory cell. For example, a charge storage dielectric may store charge in a number of localities. For some structures and programming techniques, the charge may be stored substantially uniformly along the device channel length when the programming mechanism acts uniformly along the channel (e.g., such as by tunneling), or the charge may be stored just at the source or drain edges when a programming mechanism such as hot carrier injection is used. Multiple bits of information could be stored in each NAND string device by locally storing charge at the source or drain edge in the case of hot electron programming, single electron memory devices or silicon filaments located at the source or drain edges. Multiple bits of information could also be stored by injecting several different levels of charge into the charge storage medium and associating different charge levels with different stored states.

In many of the embodiments described above, the block select devices are formed using the same process flow as the memory cells to reduce the number of process steps and device structures fabricated at each memory level. Thus the block select devices are formed having the same structure as the memory cells, although they may be sized differently. As used herein, such block select devices may be considered to be structurally substantially identical to the memory cell devices, even though the respective threshold voltages may be programmed or erased to different values.

It should be appreciated that the various bias voltages described herein, including negative voltages and high-voltage programming and erase voltages, may be received from external sources, or may be generated internally using any of a number of suitable techniques. It should also be appreciated that the designations top, left, bottom, and right are merely convenient descriptive terms for the four sides of a memory array. The word lines for a block may be implemented as two inter-digitated groups of word lines oriented horizontally, and the global bit lines for a block may be implemented as two inter-digitated groups of global bit line oriented vertically. Each respective group of word lines or global bit lines may be served by a respective decoder/driver circuit and a respective sense circuit on one of the four sides of the array. Suitable row and column circuits are set forth in "Multi-Headed Decoder Structure Utilizing Memory Array Line Driver with Dual Purpose Driver Device," U.S. patent application Ser. No. 10/306,887, filed Nov. 27, 2002, and in "Tree Decoder Structure Particularly Well Suited to Interfacing Array Lines Having Extremely Small Layout Pitch," U.S. patent application Ser. No. 10/306,888, filed Nov. 27, 2002, which applications are hereby incorporated by reference in their entirety. The global bit line may be driven by a bit line driver circuit, which may be either directly coupled to the global bit line or may be shared among several global bit lines and coupled by decoding circuitry to a desired global bit line. Suitable driver and decoder circuits are well known in the art.

As used herein, word lines and bit lines (e.g., including global bit lines) usually represent orthogonal array lines, and follow the common assumption in the art that word lines are driven and bit lines are sensed, at least during a read operation. Thus, the global bit lines of an array may also be referred to as sense lines of the array, and may also be referred to as simply global array lines (i.e., even though other array lines also exist). No particular implication should be drawn as to word organization by use of such terms. Moreover, as used herein, a "global bit line" is an array line that connects to NAND strings in more than one memory block, but no particular inference should be drawn suggesting such a global bit line must traverse across an entire memory array or substantially across an entire integrated circuit.

The directionality of various array lines in the various figures is merely convenient for ease of description of the two groups of crossing lines in the array. While word lines are usually orthogonal to bit lines, such is not necessarily required. Moreover, the word and bit organization of a memory array may also be easily reversed. As an additional example, portions of an array may correspond to different output bits of a given word. Such various array organizations and configurations are well known in the art, and the invention is intended to comprehend a wide variety of such variations.

It will be appreciated by one skilled in the art that any of several expressions may be equally well used when describing the operation of a circuit including the various signals and nodes within the circuit, and no subtle inferences should be read into varied usage within this description. Frequently logic signals are named in a fashion to convey which level is the active level. The schematic diagrams and accompanying description of the signals and nodes should in context be clear. As use herein, two different voltages which are "substantially equal" to each other have respective values which are close enough to cause substantially the same effect under the context at issue. Such voltages may be assumed to fall within approximately 0.5 volts of each other, unless the context requires another value. For example, a passing voltage of 5 volts or 5.5 volts may cause substantially the same effect as compared to an inhibit bias voltage of 5 volts, and thus the 5.5 volt passing voltage may be considered to be substantially identical to the 5 volt inhibit voltage.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, a NAND string within the selected block, and a memory cell within the selected NAND string based upon address signals and possibly other control signals. Similarly, the number of array blocks and the number of memory planes are also a matter of engineering decision. Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium includes at least disk, tape, or other magnetic, optical, semiconductor (e.g., flash memory cards, ROM), or electronic medium and a network, wireline, wireless or other communications medium. An encoding of a circuit may include circuit schematic information, physical layout information, behavioral simulation information, and/ or may include any other encoding from which the circuit may be represented or communicated.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though many embodiments are described in the context of a three-dimensional memory array of TFT memory cells, such limitations should not be read into the claims unless specifically recited. Moreover, the embodiments described above are specifically contemplated to be used alone as well as in various combinations. Accordingly, other embodiments, variations, and improvements not described herein are not necessarily excluded from the scope of the invention.

What is claimed is:

1. A method of operating an integrated circuit having a memory array including at least one plane of memory cells, said memory cells comprising switch devices having a charge storage dielectric and which cells are arranged in a plurality of series-connected NAND strings, said method comprising the steps of:

biasing a channel region of a half-selected memory cell in an unselected NAND string of a selected memory block, to a first voltage; and then capacitively coupling the channel region to a second voltage different than the first voltage when a selected word line associated with the half-selected memory cell transitions to a word line programming voltage, to thereby reduce a voltage potential between the selected word line and the channel region of the half-selected memory cell;

wherein the biasing step comprises:

(a) conveying a bit line inhibit voltage on a respective first array line associated with the unselected NAND string;

(b) coupling a first end of the unselected NAND string through a first group of at least one series selection device, to the respective first array line associated with the unselected NAND string; and (c) turning on the half-selected memory cell and any intervening memory cells between the half-selected memory cell and the first end of the unselected NAND string; and then (d) decoupling the channel region of the half-selected memory cell from the respective first array line after establishing the half-selected memory cell channel region to the first voltage;

wherein the method further comprises:

(e) coupling a first end of a selected NAND string of the selected memory block through a first group of at least one series selection device, to a respective first array line associated with the selected NAND string, said respective first array line conveying a bit line programming voltage;

(f) coupling the bit line programming voltage to a channel region of a selected memory cell in the selected NAND string, said selected memory cell also associated with the selected word line;

(g) turning off at least one device of a second group of at least one series selection device at a second end of the unselected NAND string opposite the first end, said second group of at least one series selection device for coupling said unselected NAND string to a respective second array line associated with the unselected NAND string; and (h) turning off at least one device of a second group of at least one series selection device at a second end of the selected NAND string opposite the first end, said second group of at least one series selection device for coupling said selected NAND string to a respective second array line associated with the selected NAND string.

2. The method of claim 1 wherein:
the respective second group of at least one series selection device at the second end of the selected and unselected NAND strings each includes at least two such selection devices, each device driven by one of a second group of select signals; and
the method further comprises driving at least two of the second group of select signals to different voltages chosen to reduce leakage current from the unselected NAND string to the respective second array line associated therewith, and to reduce leakage current from the selected NAND string to the respective second array line associated therewith, when the selected word line is driven to the word line programming voltage.

3. The method of claim 2 wherein:
the respective first array line for each NAND string comprises a respective global bit line associated therewith; and
the respective second array line for each NAND string comprises a shared bias node.

4. The method of claim 3 wherein:
the respective first group of at least one series selection device of each NAND string within the selected block numbers one such selection device; and
the respective second group of at least one series selection device of each NAND string within the selected block includes at least a first and second such selection devices.

5. The method of claim 4 wherein:
for the second group of at least one series selection device of each NAND string within the selected block, the select signal applied to the first selection device conveys a voltage that is less than the threshold voltage of the first selection device, relative to a voltage on the shared bias node, and the select signal applied to the second selection device conveys a voltage that is greater than the threshold voltage of the second selection device, relative to the shared bias node voltage.

6. The method of claim 3 further comprising:
during at least a programming pulse on the selected word line, biasing the shared bias node to a voltage between the bit line inhibit voltage and the bit line programming voltage.

7. The method of claim 2 wherein:
for the selected NAND string, the respective first array line comprises a respective global bit line associated therewith, and the respective second array line comprises a shared bias node; and
for the unselected NAND string, the respective first array line comprises a shared bias node associated therewith, and the respective second array line comprises a respective global bit line.

8. The method of claim 7 wherein:
the respective first group of at least one series selection device of each NAND string numbers at least two such selection devices; and the respective second group of at least one series selection device of each NAND string numbers at least two such selection devices.

9. The method of claim 2 further comprising:
driving unselected word lines associated with memory cells between the selected memory cell and the second end of the selected NAND string to a third passing voltage closer to the programming voltage than is the second passing voltage at least during any selected word line programming pulse, to thereby reduce programming stress across such unselected memory cells.

10. The method of claim 9 further comprising:
applying multiple selected word line programming pulses, and re-establishing the voltage bias of the half-selected memory cell channel region before each such programming pulse.

11. The method of claim 10 wherein at least one of the multiple selected word line programming pulses is less than 20 microseconds in duration.

12. A method of operating an integrated circuit having a memory array including at least one plane of memory cells, said memory cells comprising thin film modifiable conductance switch devices and which cells are arranged in a plurality of series-connected NAND strings, said method comprising the steps of:
biasing a channel region of a half-selected memory cell in an unselected NAND string of a selected memory block, to a first voltage; and then
capacitively coupling the channel region to a second voltage different than the first voltage when a selected word line associated with the half-selected memory cell transitions to a word line programming voltage, to thereby reduce a voltage potential between the selected word line and the channel region of the half-selected memory cell;
wherein the biasing step comprises:
(a) conveying a bit line inhibit voltage on a respective first array line associated with the unselected NAND string;
(b) coupling a first end of the unselected NAND string through a first group of at least one series selection device, to the respective first array line associated with the unselected NAND string; and
(c) turning on the half-selected memory cell and any intervening memory cells between the half-selected memory cell and the first end of the unselected NAND string; and then
(d) decoupling the channel region of the half-selected memory cell from the respective first array line after establishing the half-selected memory cell channel region to the first voltage;
wherein the method further comprises:
(e) coupling a first end of a selected NAND string of the selected memory block through a first group of at least one series selection device, to a respective first array line associated with the selected NAND string, said respective first array line conveying a bit line programming voltage;
(f) coupling the bit line programming voltage to a channel region of a selected memory cell in the selected NAND string, said selected memory cell also associated with the selected word line;
(g) turning off at least one device of a second group of at least one series selection device at a second end of the unselected NAND string opposite the first end, said second group of at least one series selection device for coupling said unselected NAND string to a respective second array line associated with the unselected NAND string; and (h) turning off at least one device of a second group of at least one series selection device at a second end of the selected NAND string opposite the first end, said second group of at least one series selection device for coupling said selected NAND string to a respective second array line associated with the selected NAND string.

13. The method of claim 12 wherein:

the respective second group of at least one series selection device at the second end of the selected and unselected NAND strings each includes at least two such selection devices, each device driven by one of a second group of select signals; and the method further comprises driving at least two of the second group of select signals to different voltages chosen to reduce leakage current from the unselected NAND string to the respective second array line associated therewith, and to reduce leakage current from the selected NAND string to the respective second array line associated therewith, when the selected word line is driven to the word line programming voltage.

14. The method of claim 13 wherein:

the respective first array line for each NAND string comprises a respective global bit line associated therewith; and the respective second array line for each NAND string comprises a shared bias node.

15. The method of claim 14 wherein:

the respective first group of at least one series selection device of each NAND string within the selected block numbers one such selection device; and the respective second group of at least one series selection device of each NAND string within the selected block includes at least a first and second such selection devices.

16. The method of claim 15 wherein:

for the second group of at least one series selection device of each NAND string within the selected block, the select signal applied to the first selection device conveys a voltage that is less than the threshold voltage of the first selection device, relative to a voltage on the shared bias node, and the select signal applied to the second selection device conveys a voltage that is greater than the threshold voltage of the second selection device, relative to the shared bias node voltage.

17. The method of claim 14 further comprising:

during at least a programming pulse on the selected word line, biasing the shared bias node to a voltage between the bit line inhibit voltage and the bit line programming voltage.

18. The method of claim 13 wherein:

for the selected NAND string, the respective first array line comprises a respective global bit line associated therewith, and the respective second array line comprises a shared bias node; and for the unselected NAND string, the respective first array line comprises a shared bias node associated therewith, and the respective second array line comprises a respective global bit line.

19. The method of claim 18 wherein:

the respective first group of at least one series selection device of each NAND string numbers at least two such selection devices; and the respective second group of at least one series selection device of each NAND string numbers at least two such selection devices.

20. The method of claim 13 further comprising:

driving unselected word lines associated with memory cells between the selected memory cell and the second end of the selected NAND string to a third passing voltage closer to the programming voltage than is the second passing voltage at least during any selected word line programming pulse, to thereby reduce programming stress across such unselected memory cells.

21. The method of claim 20 further comprising:

applying multiple selected word line programming pulses, and re-establishing the voltage bias of the half-selected memory cell channel region before each such programming pulse.

22. The method of claim 21 wherein at least one of the multiple selected word line programming pulses is less than 20 microseconds in duration.

23. An integrated circuit comprising:

a memory array having at least one plane of memory cells, said memory cells comprising switch devices having a charge storage dielectric and which cells are arranged in a plurality of series-connected NAND strings; and means for biasing a channel region of a half-selected memory cell in an unselected NAND string of a selected memory block, to a first voltage; and means for capacitively coupling the channel region to a second voltage different than the first voltage when a selected word line associated with the half-selected memory cell transitions to a word line programming voltage, to thereby reduce a voltage potential between the selected word line and the channel region of the half-selected memory cell;

wherein the means for biasing comprises:

means for conveying a bit line inhibit voltage on a respective first array line associated with the unselected NAND string;

means for coupling a first end of the unselected NAND string through a first group of at least one series selection device, to the respective first array line associated with the unselected NAND string; and means for turning on the half-selected memory cell and any intevening memory cells between the half-selected memory cell and the first end of the unselected NAND string; and means for decoupling the channel region of the half-selected memory cell from the respective first array line after establishing the half-selected memory cell channel region to the first voltage;

said integrated circuit further comprising:

means for coupling a first end of a selected NAND string of the selected memory block through a first group of at least one series selection device, to a respective first array line associated with the selected NAND string, said respective first array line conveying a bit line programming voltage;

means for coupling the bit line programming voltage to a channel region of a selected memory cell in the selected NAND string, said selected memory cell also associated with the selected word line;

means for turning off at least one device of a second group of at least one series selection device at a second end of the unselected NAND string opposite the first end, said second group of at least one series selection device for coupling said unselected NAND string to a respective second array line associated with the unselected NAND string; and means for turning off at least one device of a second group of at least one series selection device at a second end of the selected NAND string opposite the first end, said second group of at least one series selection device for coupling said selected NAND string to a respective second array line associated with the selected NAND string.

24. The integrated circuit of claim 23 wherein:

the respective second group of at least one series selection device at the second end of the selected and unselected NAND strings each includes at least two such selection devices, each device driven by one of a second group of select signals; and at least two of the second group of select signals are driven to different voltages chosen to reduce leakage current from the unselected NAND string to the respective second array line associated therewith, and to reduce leakage current from the selected NAND string to the respective second array line associated therewith, when the selected word line is driven to the word line programming voltage.

25. The integrated circuit of claim 24 wherein:

the respective first array line for each NAND string comprises a respective global bit line associated therewith; and the respective second array line for each NAND string comprises a shared bias node.

26. The integrated circuit of claim 25 wherein:

the respective first group of at least one series selection device of each NAND string within the selected block numbers one such selection device; and the respective second group of at least one series selection device of each NAND string within the selected block includes at least a first and second such selection devices.

27. The integrated circuit of claim 26 wherein:

for the second group of at least one series selection device of each NAND string within the selected block, the select signal applied to the first selection device conveys a voltage that is less than the threshold voltage of the first selection device, relative to a voltage on the shared bias node, and the select signal applied to the second selection device conveys a voltage that is greater than the threshold voltage of the second selection device, relative to the shared bias node voltage.

28. The integrated circuit of claim 25 wherein:

during at least a programming pulse on the selected word line, the shared bias node is driven to a voltage between the bit line inhibit voltage and the bit line programming voltage.

29. The integrated circuit of claim 24 wherein:

for the selected NAND string, the respective first array line comprises a respective global bit line associated therewith, and the respective second array line comprises a shared bias node; and for the unselected NAND string, the respective first array line comprises a shared bias node associated therewith, and the respective second array line comprises a respective global bit line.

30. The integrated circuit of claim 29 wherein:

the respective first group of at least one series selection device of each NAND string numbers at least two such selection devices; and the respective second group of at least one series selection device of each NAND string numbers at least two such selection devices.

31. The integrated circuit of claim 24 wherein:

unselected word lines associated with memory cells between the selected memory cell and the second end of the selected NAND string are driven to a third passing voltage closer to the programming voltage than is the second passing voltage at least during any selected word line programming pulse, to thereby reduce programming stress across such unselected memory cells.

32. The integrated circuit of claim 31 configured to apply multiple selected word line programming pulses, and to re-establish the voltage bias of the half-selected memory cell channel region before each such programming pulse.

33. The integrated circuit of claim 32 wherein at least one of the multiple selected word line programming pulses is less than 20 microseconds in duration.

34. An integrated circuit comprising:

a memory array having at least one plane of memory cells, said memory cells comprising thin film modifiable conductance switch devices and which cells are arranged in a plurality of series-connected NAND strings; and means for biasing a channel region of a half-selected memory cell in an unselected NAND string of a selected memory block, to a first voltage; and means for capacitively coupling the channel region to a second voltage different than the first voltage when a selected word line associated with the half-selected memory cell transitions to a word line programming voltage, to thereby reduce a voltage potential between the selected word line and the channel region of the half-selected memory cell;

wherein the means for biasing comprises:

means for conveying a bit line inhibit voltage on a respective first array line associated with the unselected NAND string;

means for coupling a first end of the unselected NAND string through a first group of at least one series selection device, to the respective first array line associated with the unselected NAND string; and means for turning on the half-selected memory cell and any intervening memory cells between the half-selected memory cell and the first end of the unselected NAND string; and means for decoupling the channel region of the half-selected memory cell from the respective first array line after establishing the half-selected memory cell channel region to the first voltage;

said integrated circuit further comprising:

means for coupling a first end of a selected NAND string of the selected memory block through a first group of at least one series selection device, to a respective first array line associated with the selected NAND string, said respective first array line conveying a bit line programming voltage;

means for coupling the bit line programming voltage to a channel region of a selected memory cell in the selected NAND string, said selected memory cell also associated with the selected word line;

means for turning off at least one device of a second group of at least one series selection device at a second end of the unselected NAND string opposite the first end, said second group of at least one series selection device for coupling said unselected NAND string to a respective second array line associated with the unselected NAND string; and means for turning off at least one device of a second group of at least one series selection device at a second end of the selected NAND string opposite the first end, said second group of at least one series selection device for coupling said selected NAND string to a respective second array line associated with the selected NAND string.

35. The integrated circuit of claim 34 wherein:

the respective second group of at least one series selection device at the second end of the selected and unselected NAND strings each includes at least two such selection devices, each device driven by one of a second group of select signals; and at least two of the second group of select signals are driven to different voltages chosen to reduce leakage current from the unselected NAND string to the respective second array line associated therewith, and to reduce leakage current from the selected NAND string to the respective second array line associated therewith, when the selected word line is driven to the word line programming voltage.

36. The integrated circuit of claim 35 wherein:

the respective first array line for each NAND string comprises a respective global bit line associated therewith; and the respective second array line for each NAND string comprises a shared bias node.

37. The integrated circuit of claim 36 wherein:

the respective first group of at least one series selection device of each NAND string within the selected block numbers one such selection device; and the respective second group of at least one series selection device of each NAND string within the selected block includes at least a first and second such selection devices.

38. The integrated circuit of claim 37 wherein:

for the second group of at least one series selection device of each NAND string within the selected block, the select signal applied to the first selection device conveys a voltage that is less than the threshold voltage of the first selection device, relative to a voltage on the shared bias node, and the select signal applied to the second selection device conveys a voltage that is greater than the threshold voltage of the second selection device, relative to the shared bias node voltage.

39. The integrated circuit of claim 36 wherein:

during at least a programming pulse on the selected word line, the shared bias node is biased to a voltage between the bit line inhibit voltage and the bit line programming voltage.

40. The integrated circuit of claim 35 wherein:

for the selected NAND string, the respective first array line comprises a respective global bit line associated therewith, and the respective second array line comprises a shared bias node; and for the unselected NAND string, the respective first array line comprises a shared bias node associated therewith, and the respective second array line comprises a respective global bit line.

41. The integrated circuit of claim 40 wherein:

the respective first group of at least one series selection device of each NAND string numbers at least two such selection devices; and the respective second group of at least one series selection device of each NAND string numbers at least two such selection devices.

42. The integrated circuit of claim 35 wherein:

unselected word lines associated with memory cells between the selected memory cell and the second end of the selected NAND string are driven to a third passing voltage closer to the programming voltage than is the second passing voltage at least during any selected word line programming pulse, to thereby reduce programming stress across such unselected memory cells.

43. The integrated circuit of claim 42 configured to:

apply multiple selected word line programming pulses, and re-establish the voltage bias of the half-selected memory cell channel region before each such programming pulse.

44. The integrated circuit of claim 43 wherein at least one of the multiple selected word line programming pulses is less than 20 microseconds in duration.

* * * * *